United States Patent
Aiki et al.

(10) Patent No.: US 7,190,593 B2
(45) Date of Patent: Mar. 13, 2007

(54) SEMICONDUCTOR INTEGRATED CIRCUIT DEVICE

(75) Inventors: Kiyoshi Aiki, Hachioji (JP); Kazunori Hikone, Naka (JP); Hiroyuki Adachi, Koganei (JP); Masayoshi Okamoto, Ryuo (JP); Masao Onose, Kodaira (JP); Yuji Mizuno, Kodaira (JP)

(73) Assignee: Renesas Technology Corporation, Tokyo (JP)

( * ) Notice: Subject to any disclaimer, the term of this patent is extended or adjusted under 35 U.S.C. 154(b) by 311 days.

(21) Appl. No.: 10/022,732

(22) Filed: Dec. 20, 2001

(65) Prior Publication Data

US 2002/0117729 A1   Aug. 29, 2002

(30) Foreign Application Priority Data

Jan. 30, 2001   (JP)   ............................. 2001-021303
Sep. 3, 2001    (JP)   ............................. 2001-265210

(51) Int. Cl.
   H05K 7/10    (2006.01)
   H05K 7/12    (2006.01)
(52) U.S. Cl. ...................................... 361/767; 361/760
(58) Field of Classification Search ................. 257/48; 324/763, 765
   See application file for complete search history.

(56) References Cited

U.S. PATENT DOCUMENTS

| | | | |
|---|---|---|---|
| 5,059,899 A * | 10/1991 | Farnworth et al. | 438/18 |
| 5,239,191 A * | 8/1993 | Sakumoto et al. | 257/203 |
| 5,532,614 A * | 7/1996 | Chiu | 324/763 |
| 5,641,978 A * | 6/1997 | Jassowski | 257/203 |
| 5,760,643 A * | 6/1998 | Whetsel | 327/565 |
| 5,923,047 A * | 7/1999 | Chia et al. | 257/48 |
| 6,356,095 B1 * | 3/2002 | Komoriya | 324/763 |
| 6,433,628 B1 * | 8/2002 | Morris | 327/565 |
| 6,759,865 B1 * | 7/2004 | Gu et al. | 324/765 |
| 6,930,380 B2 * | 8/2005 | Shimanuki et al. | 257/691 |

FOREIGN PATENT DOCUMENTS

JP    4-133338    9/1990

* cited by examiner

Primary Examiner—Tuan Dinh
(74) Attorney, Agent, or Firm—Reed Smith LLP; Stanley P. Fisher, Esq.; Juan Carlos A. Marquez, Esq.

(57) ABSTRACT

A semiconductor integrated circuit device is provided in which (i) inspection pads are arranged along one side or two opposite sides of the semiconductor integrated circuit device for bonding pads arranged along the sides other than the side or the two opposite sides and (ii) the bonding pads are connected to their respective inspection pads by connection wires The inspection is carried out by applying probe needles to the pads (inspection pads and bonding pads) arranged only along one side or two opposite sides of the semiconductor integrated circuit device. The invention also provides a semiconductor integrated circuit package with leads on four sides includes a semiconductor integrated circuit device with bonding pads laid along one pair of opposite sides of the four sides, and a table for supporting the semiconductor integrated circuit device. While the bonding pads along the pair of opposite sides of the semiconductor integrated circuit device are connected with leads along the four sides of the package, and some leads are bent toward the respective pads. The present invention the inspection of a plurality of semiconductor integrated circuit devices with probe needles at a time.

2 Claims, 27 Drawing Sheets

SEMICONDUCTOR INTEGRATED CIRCUIT DEVICE

FIELD OF THE INVENTION

The present invention relates to a semiconductor integrated circuit device to be formed on a wafer. More specifically, the present invention relates to methods for manufacturing and inspecting semiconductor integrated circuit devices which reduce the inspecting time with probe needles.

BACKGROUND OF THE INVENTION

The process of manufacturing semiconductor integrated circuit devices mainly comprises a wafer fabrication sub-process for forming semiconductor integrated circuit devices in a grid pattern on a wafer and an assembly sub-process for cutting or dicing the wafer into individual semiconductor integrated circuit devices then packaging. In the last step of the wafer fabrication sub-process, the electric characteristics of each semiconductor integrated circuit device are inspected to determine whether it is defective. Such inspection called probing.

Referring to FIGS. 16 to 20, examples of prior art will be described.

FIG. 16 shows an arrangement of semiconductor integrated circuit devices on a wafer. In general, each semiconductor integrated circuit device is rectangular, and several thousands of semiconductor integrated circuit devices 1 are formed in a grid pattern on a wafer 10.

To perform the probing, it is necessary to connect electrically an IC tester to each semiconductor integrated circuit device 1. The probing is generally carried out by attaching the tips of probe needles 8 (cantilevered tungsten needles, etc.) to a probe card into mechanical contact with the bonding pads 9 of each semiconductor integrated circuit device 1. The probing of a wafer is finished by shifting the probe card to the next semiconductor integrated circuit device 1, and repeating the same step several thousands times.

Shown in FIG. 17 are the tips of probes put into contact with the bonding pads of a semiconductor integrated circuit device 1 and shown in FIG. 18 is wire bonding. The semiconductor integrated circuit device 1 shown in FIG. 17 has an internal logic area 5 in its central area, an input and output buffer area 3 around the internal logic area 5, and a pad area 2 around the input and output buffer area 3.

Input and output buffers 4 are arranged in the input and output buffer area 3 and bonding pads 9 (six bonding pads, each indicated by an empty box, are arranged along each side in FIG. 17) are arranged in the pad area 2.

If the bonding pads 9 are arranged along the four sides of a semiconductor integrated circuit device 1, a probe card with probe needles 8 are arranged so that the probe needles 8 are positioned along the four sides of the semiconductor integrated circuit device 1, as shown in FIG. 17.

If bonding pads 9 are arranged along the four sides of a semiconductor integrated circuit device 1, the lead frame of the package is disposed outside the bonding pads 9, along the four sides of the semiconductor integrated circuit device 1, to connect each bonding pad 9 to an inner lead 7 with a bonding wire 6 as shown in FIG. 18. Namely, because the bonding pads 9 are arranged along the four sides of the semiconductor integrated circuit device 1, the inner leads 7 are arranged along the four sides of the package to simply the connections between the bonding pads 9 to the inner leads 7.

One typical example of the wire bonding is the above connection of bonding pads 9 and inner leads 7 with bonding wires 6.

As described above, probes have usually been put into contact with the bonding pads arranged along the four sides of the semiconductor integrated circuit device because the bonding pads are used for probing.

FIGS. 19 and 20 show how probe cards and their probes being in contact with bonding pads.

Shown in FIG. 19(a) are a semiconductor integrated circuit device 1 of which the bonding pads are arranged along its four sides and a probe card 19a in a common shape of which the probe needles 8 are arranged so as to be positioned along the four sides of the semiconductor integrated circuit device 1, to inspect it. The probe card 19a inspects one semiconductor integrated circuit device 1 at a time.

Shown in FIG. 19(b) are a semiconductor integrated circuit device 1 of which the bonding pads are arranged along its four sides and a probe card 19b in a special shape which inspects two semiconductor integrated circuit devices 1 at a time. Some probe needles 8 are slanted to access the bonding pads on some sides of the semiconductor integrated circuit device 1, accordingly the probe card 19b is difficult to make and costly.

Shown in FIG. 20(a) are four semiconductor integrated circuit devices 1 and a probe card 20a to inspect four devices 1 at a time. The bonding pads of each semiconductor integrated circuit device 1 are arranged along two opposite sides of the device 1 and the probe needles 8 of the probe card 20a are arranged in two rows.

Shown in FIG. 20(b) are eight semiconductor integrated circuit devices 1 (four devices/row×two rows) and a probe card 20b to inspect eight devices 1 at a time. The bonding pads of each semiconductor integrated circuit device 1 are arranged along two opposite sides of the device 1 and the probe needles 8 of the probe card 20b are arranged in four rows.

Shown in FIG. 20(c) are 16 semiconductor integrated circuit devices 1 (four devices/row×four rows) and a probe card 20c to inspect 16 devices 1 at a time. The bonding pads of each semiconductor integrated circuit device 1 are arranged along a side of the device 1 and the probes 8 of the probe card 20c are arranged in four rows.

Although the probe cards 20b and 20c have four rows of probes 8, they are relatively easy to make because no probes are slant.

As described above, it is important to make such probe cards for inspecting a plurality of semiconductor integrated circuit devices at a time easy to produce and inexpensive. For the purposes, it is desirable to arrange bonding pads along one side or two opposite sides rather than the four sides of each semiconductor integrated circuit device 1.

A semiconductor integrated circuit device with bonding pads along its two opposite sides is disclosed in JP-A-133338/1992.

As described above, semiconductor integrated circuit devices with bonding pads on their four sides have to be inspected one by one unless probe cards in special shapes as mentioned above are used. Every time one semiconductor integrated circuit device has been inspected, the probe card has to be shifted to the next device and its probes have to be put into contact with the bonding pads of the device; accordingly the inspection time per wafer is as long as the inspection time per semiconductor integrated circuit device multiplied by the number of devices on a wafer. Such a long inspection time directly affects the manufacturing cost of semiconductor integrated circuit devices. This cost-increasing factor can not be ignored in manufacturing inexpensive semiconductor integrated circuit devices in particular.

In accordance with the above, the object of the present invention is to provide an improved semiconductor integrated circuit device of which a plurality of units on a wafer to easily be inspected at a time so as to reduce the time and cost of the inspection.

SUMMARY OF THE INVENTION

To accomplish the above object, the present invention provides a semiconductor integrated circuit device with an improved circuit configuration as described below.

To facilitate the inspection of a plurality of semiconductor integrated circuit devices on a wafer with probes at a time, the present invention provides a semiconductor integrated circuit device in which (i) inspection pads are arranged along one side or two opposite sides of the semiconductor integrated circuit device for the bonding pads arranged along the sides other than the side or the two opposite sides with the inspection pads, and (ii) the bonding pads are connected to their respective inspection pads by connection wires.

It is desirable that a plurality of the above semiconductor integrated circuit devices are arranged on a wafer so as to arrange the sides with the inspection pads in one straight line or in parallel straight lines.

It is yet desirable that the connection wires connecting the bonding pads with the inspection pads are laid outside the bonding pads and the inspection pads.

It is still desirable that the connection wires connecting the bonding pads with their respective inspection pads have the same length.

It is desirable that (i) the inspection pads and the connection wires are laid in a scribing area, and (ii) the inspection pads and bonding pads are arranged zigzag such that the inspection pads and the connection wires can be removed from the semiconductor integrated circuit device when the semiconductor integrated circuit device is cut off from the wafer at the scribing area after the semiconductor integrated circuit device has been inspected with probes.

It is yet desirable that (i) the connection wires connecting the bonding pads with their respective inspection pads are laid in a single wiring layer or a plurality of wiring layers and (ii) GND lines are laid between the connection wires or at least one GND layer is formed between the wiring layers.

It is still desirable that an electrostatic discharge protection element is disposed in the vicinity of each inspection pad.

The effect obtained by adopting the circuit configuration of the present invention will be described later in detail.

Other objects and other configurations of the semiconductor integrated circuit device of the present invention and their effect will be presented in the following description of preferred embodiments of the invention.

DETAILED DESCRIPTION OF THE PREFERRED EMBODIMENTS

Referring to drawings, the preferred embodiments of semiconductor integrated circuit device of the present invention are described below.

First Embodiment

Figure 1:
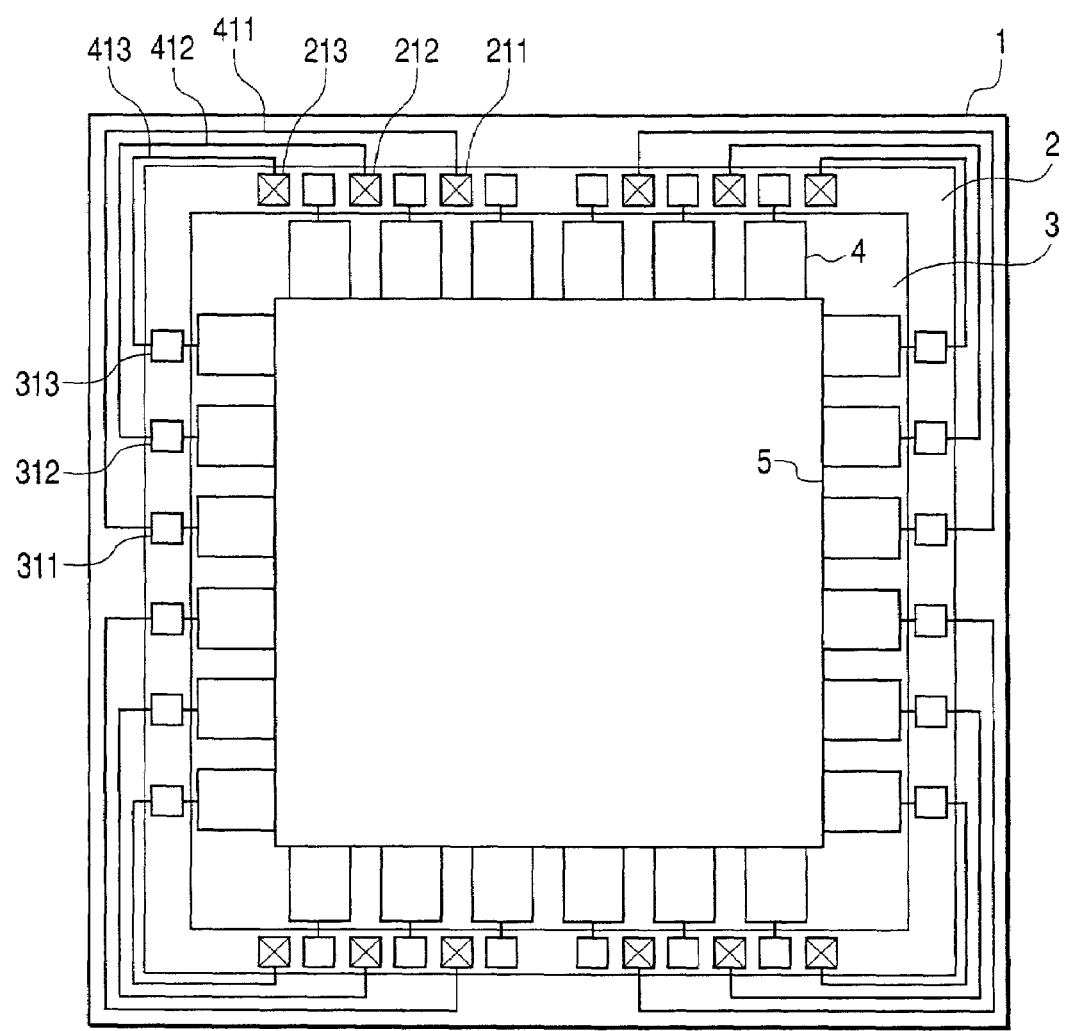
FIG. 1 shows the relative disposition of inspection pads and their connection wires in a semiconductor integrated circuit device of a first embodiment of the present invention.
Figure 2:
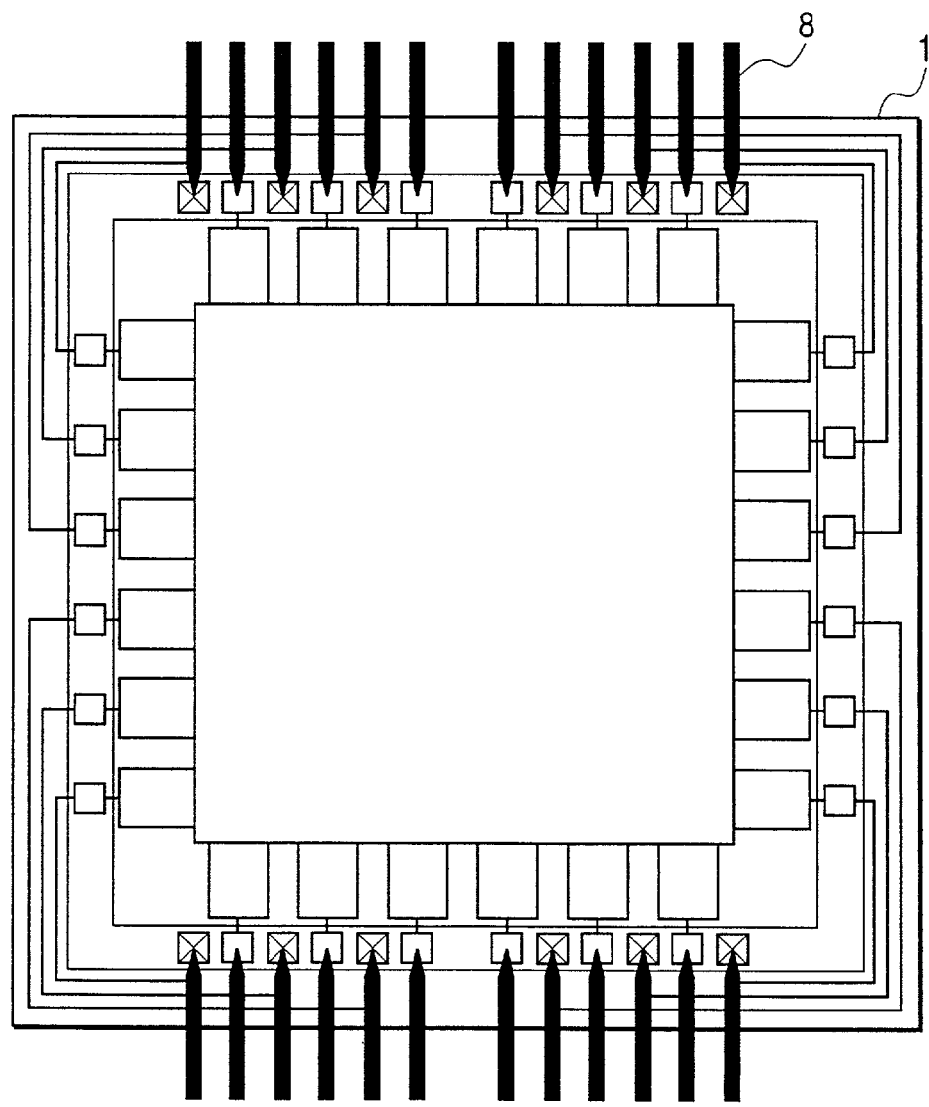
FIG. 2 shows how probe needles are applied to the bonding pads and the inspection pads provided along the upper and lower sides of the circuit during the inspection of the semiconductor integrated circuit device of the first embodiment of the present invention in FIG. 1.

Referring to FIGS. 1 to 4, a semiconductor integrated circuit device with inspection pads arranged along its two opposite sides is described. FIG. 1 shows the inspection pads and their wiring of the semiconductor integrated circuit device. FIG. 2 shows the probing of the device.

The semiconductor integrated circuit device 1 shown in FIG. 1 has an internal logic area 5 in its central area, an input and output buffer area 3 around the internal logic area 5, and a pad area 2 around the input and output buffer area 3. The input and output buffers 4 are arranged in the input and output buffer area 3. Bonding pads 311, 312, 313, etc. (six bonding pads, each indicated by an empty box, are arranged along each of the four sides in FIG. 1) are arranged in the pad area 2. Inspection pads 211, 212, 213, etc. (six pads, each indicated by a box with an X inside, are arranged along each of the upper and lower sides) are also arranged in the pad area 2. The semiconductor integrated circuit device 1 is characterized by the six inspection pads arranged along the opposite upper and lower sides. The inspection pads along the opposite upper and lower sides are connected to their corresponding bonding pads along the opposite right and left sides by connection wires running in the area outside the pad area 2. In this example of the connection wiring, the bonding pad 311 is connected to the inspection pad 211 by a connection wire 411, the bonding pad 312 is connected to the inspection pad 212 by a connection wire 412, the bonding pad 313 is connected to the inspection pad 213 by an connection wire 413, and so on, as shown in FIG. 1.

With the above configuration, inspecting the semiconductor integrated circuit device 1 by applying probes to the inspection pads 211, 212, 213, etc. along the upper and lower sides is equivalent to inspecting the semiconductor integrated circuit device 1 by applying probes to the bonding pads 311, 312, 313, etc. along the right and left sides. In other words, probing with twenty four pads (twelve bonding pads and twelve inspection pads) along the upper and lower sides according to the present embodiment is equivalent to probing with twenty four bonding pads along the upper, lower, right, and left sides.

Figure 6:
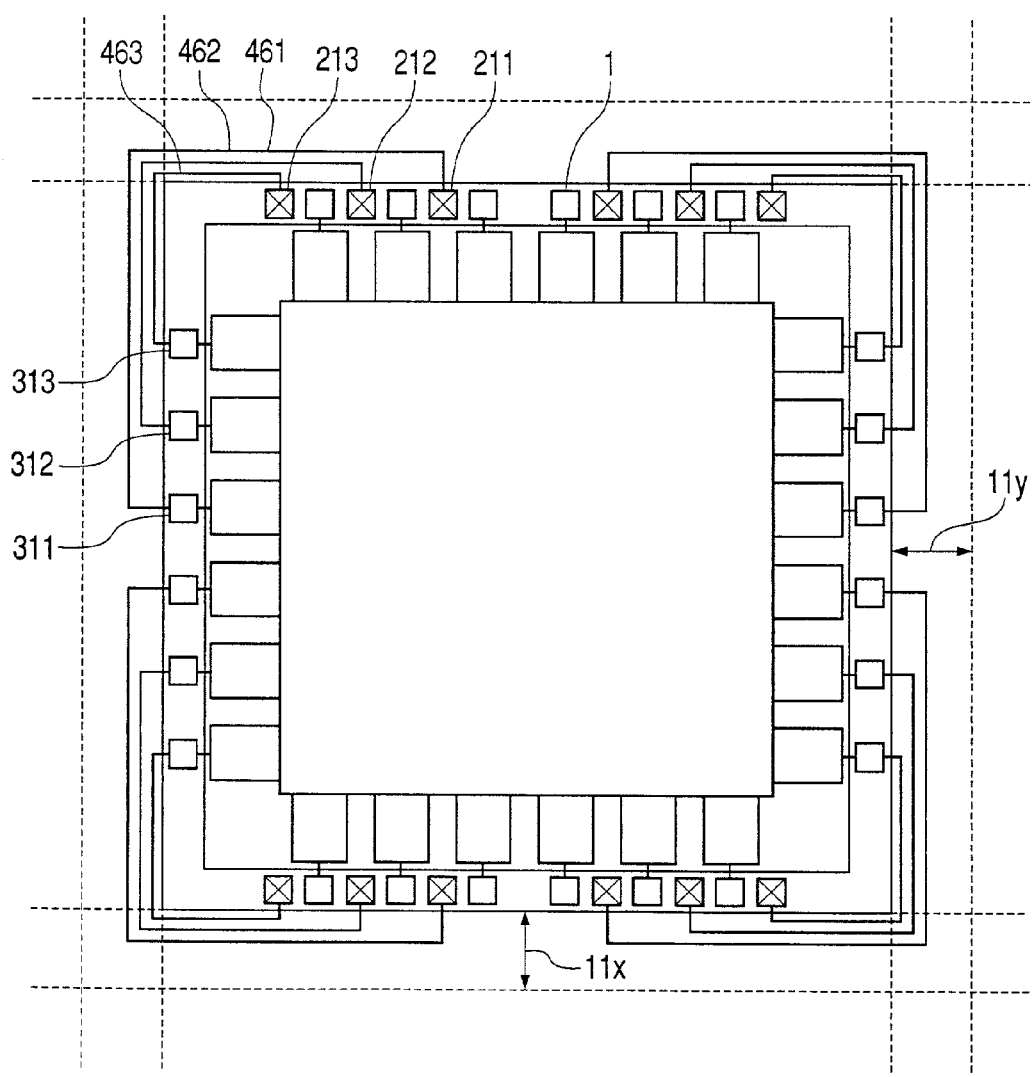
FIG. 6 shows the connection wires between the pads are laid in a scribing area of the semiconductor integrated circuit device of the first embodiment of the present invention in FIG. 2.
Figure 9:
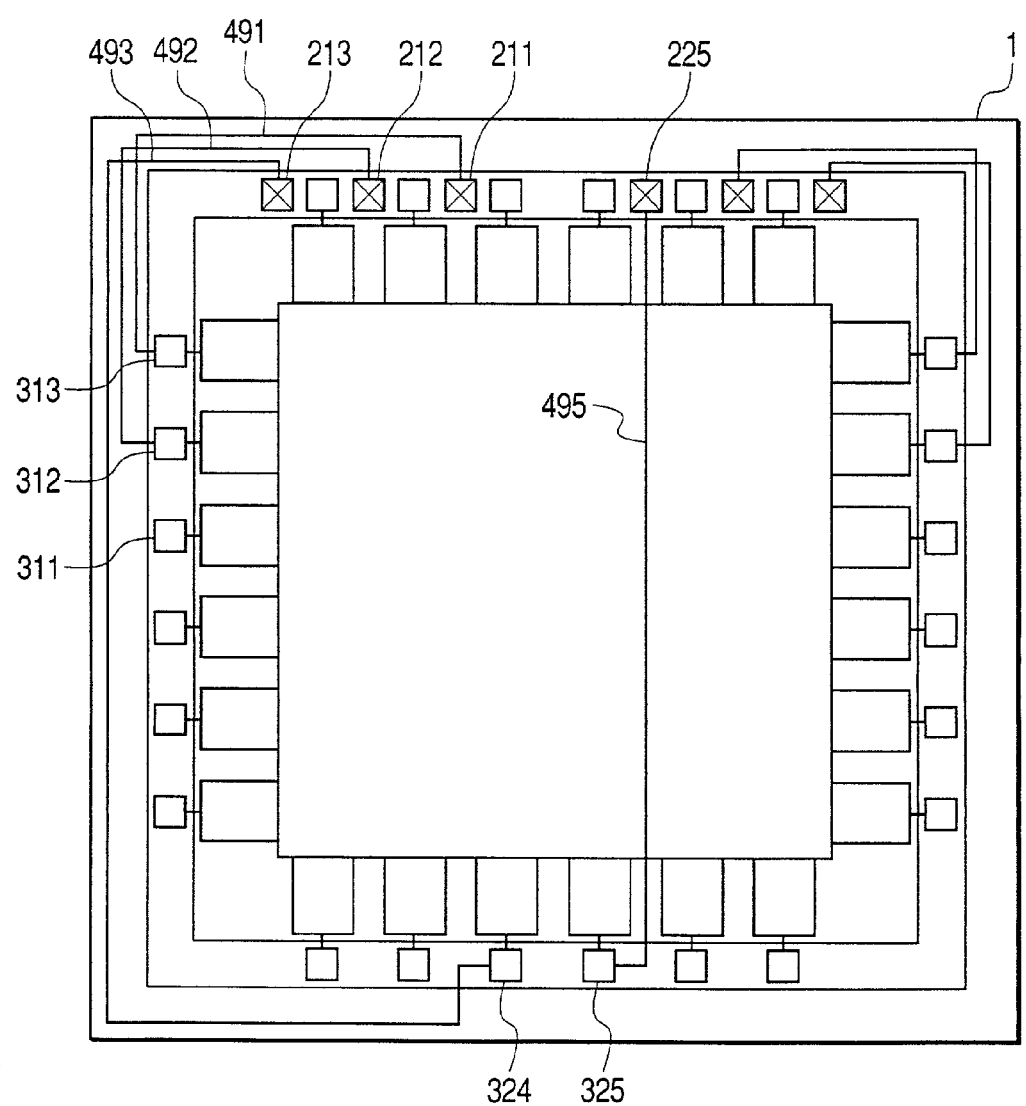
FIG. 9 shows the relative disposition of inspection pads and their connection wires in a semiconductor integrated circuit device of a second embodiment of the present invention.

The connection wires 411, 412, 413, etc. may be laid in the input and output buffer area 3 or the internal logic area 5. Referring to FIGS. 6, 9, etc., such connection wiring are described later when the inspection pad is basically given the same size as the bonding pad. When there is no bonding wire is connected to the inspection pad, the size of the inspection pad may be reduced so long as a probe can be applied to it.

In FIG. 2, the probes are applied to the pads (bonding pads and inspection pads) along the upper and lower sides. As described above, the probing of the semiconductor integrated circuit device 1 can be made by applying probes to the pads on the upper and lower sides. Namely, twenty four probe needles 8 are applied to the two groups of pads, each group consisting of twelve pads, on the upper and lower sides.

Figure 3:
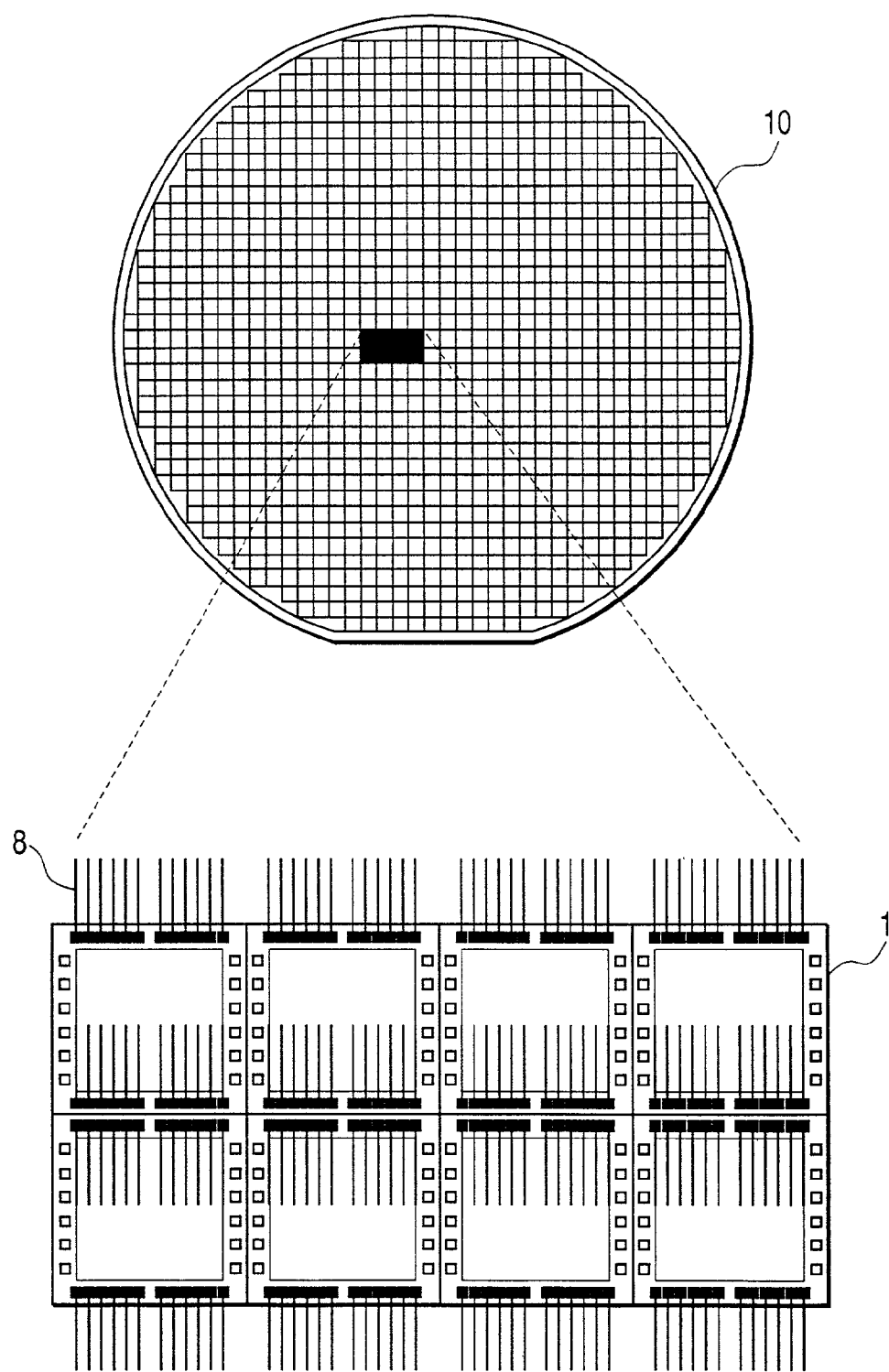
FIG. 3 shows how the probe needles are applied on a wafer at a time during the inspection of a plurality of semiconductor integrated circuit devices of the first embodiment of the present invention in FIG. 1.

In FIG. 3, a plurality of semiconductor integrated circuit devices 1 on a wafer is being inspected at a time.

Formed in a grid pattern on the wafer 10 are semiconductor integrated circuit devices 1 of which the pads to be probed are aligned. Because each semiconductor integrated circuit device 1 has pads to be probed along its upper and lower sides, the pads to be probed of a plurality of the devices 1 can be arranged in upper and lower lateral straight rows. By using 192 probe needles 8 (24 probe needles/device×4 devices/row×2 rows), eight devices 1 (4 devices/row×2 rows) can be inspected at a time. Because eight devices 1 are inspected at a time, the inspection time for one wafer 10 is reduced to one eighth.

Figure 4:
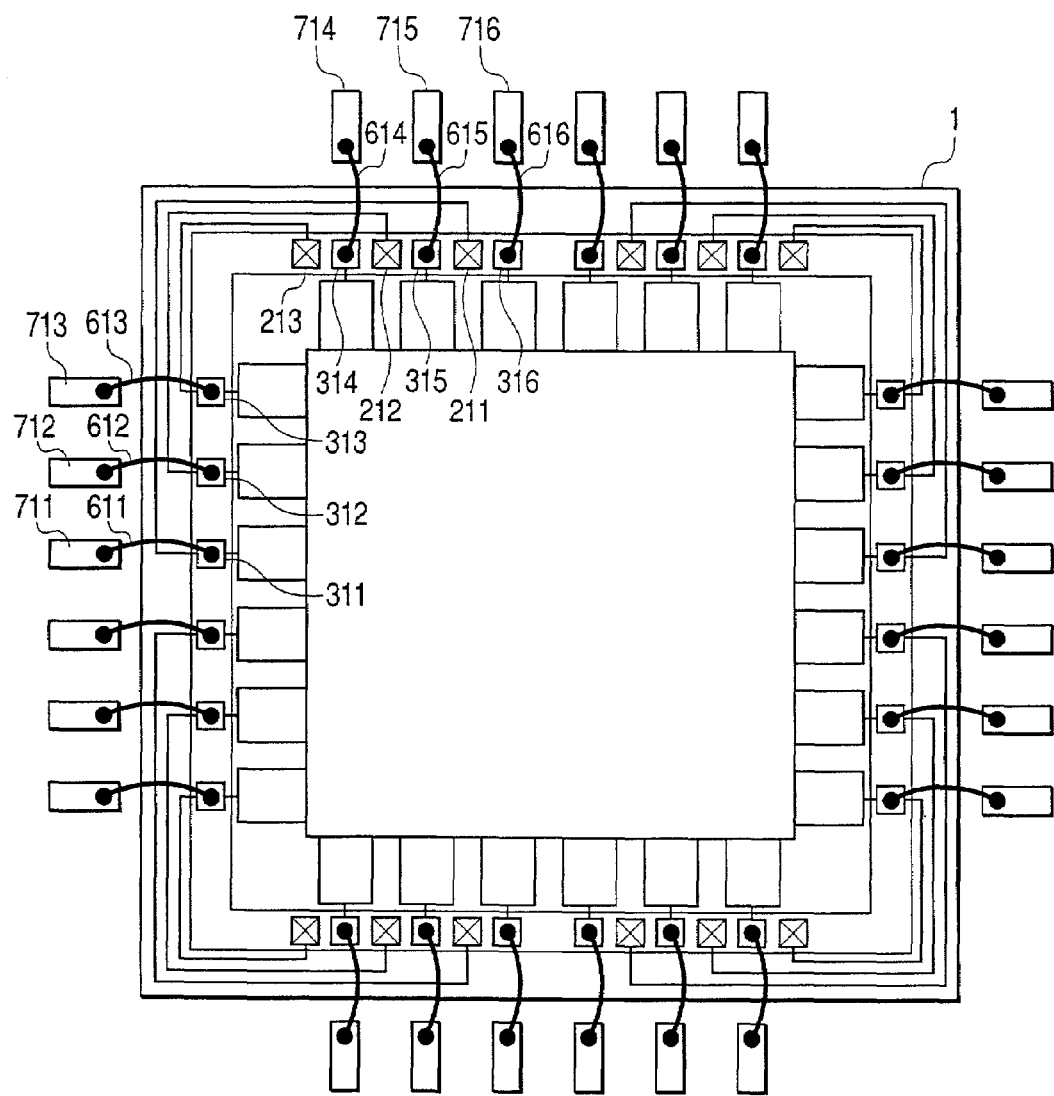
FIG. 4 shows the wire bonding of the semiconductor integrated circuit device of the first embodiment of the present invention in FIG. 1.

FIG. 4 shows the wire bonding of the semiconductor integrated circuit device 1. In the figure, an inner lead of the package is connected to each bonding pad. In other words, because the bonding pads are arranged along the four sides of the semiconductor integrated circuit device 1 and the leads are arranged along the four sides of the package, the bonding pads and the inner leads are simply connected together.

As an example of the wire bonding, the bonding pad 311 is connected to an inner lead 711 by a bonding wire 611, the bonding pad 312 is connected to an inner lead 712 by a bonding wire 612, the bonding pad 313 is connected to an inner lead 713 by a bonding wire 613, the bonding pad 314 is connected to an inner lead 714 by a bonding wire 614, the bonding pad 315 is connected to an inner lead 715 by a bonding wire 615, the bonding pad 316 is connected to an inner lead 716 by a bonding wire 616, and so on, as shown in FIG. 4. No bonding wires are connected to the inspection pads 211, 212, 213, etc.

As described above, because the inspection pads are added to two opposite sides of each semiconductor integrated circuit device of the present embodiment and are connected to their respective bonding pads by connection wires, the probing of said semiconductor integrated circuit device is made by applying probes to the two opposite sides alone. Accordingly, the probe card inspects easily inexpensively and eight devices at a time, which reduces the inspection time to one eighth. Besides, since the bonding pads are arranged on the four sides of the semiconductor integrated circuit device, the assembly sub-process is not affected at all.

Referring to FIGS. 5 to 8, examples of the connection wiring between bonding pads along the right and left sides and their corresponding inspection pads along the upper and lower sides of the semiconductor integrated circuit device 1 are described.

Figure 10:
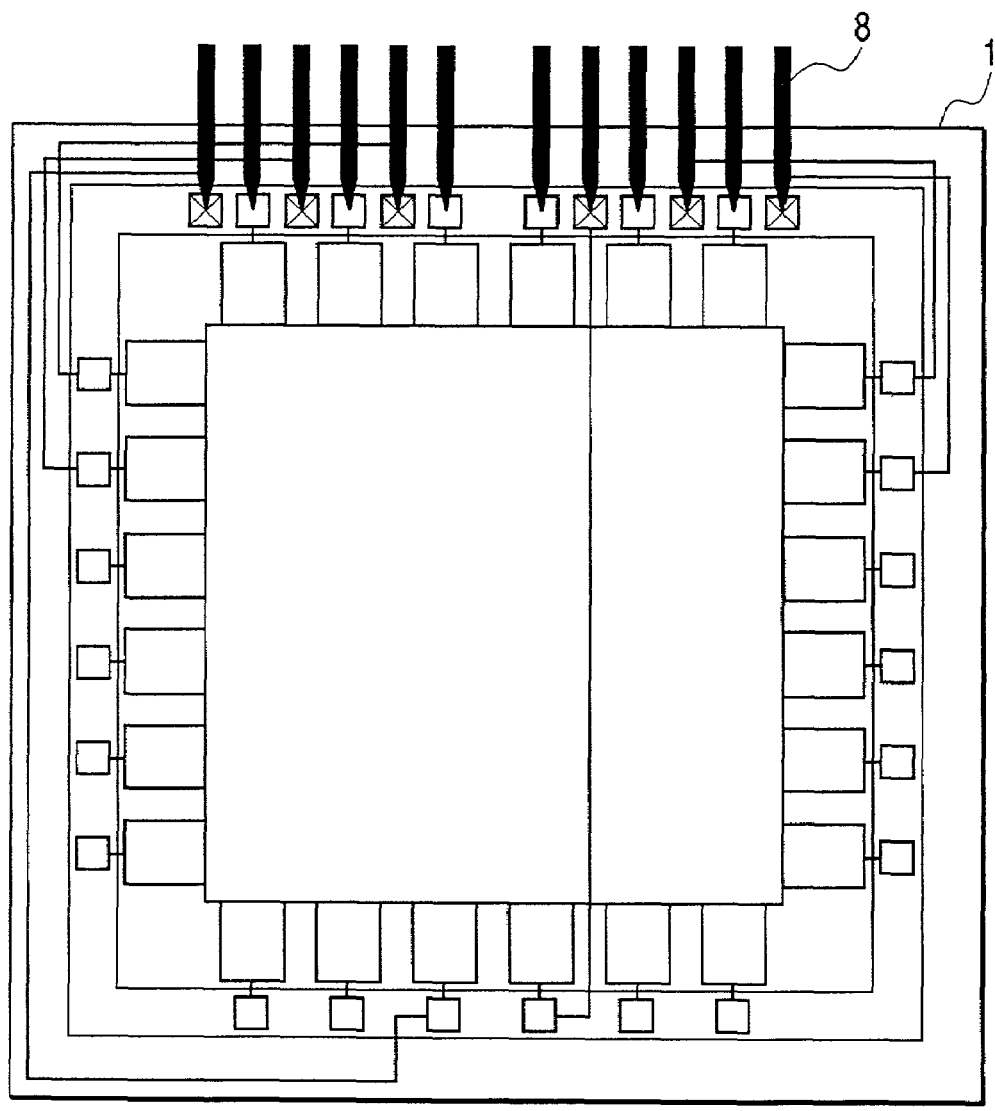
FIG. 10 shows how probe needles are applied to the bonding pads and the inspection pads provided along the upper side of the circuit during the inspection of the semiconductor integrated circuit device of the second embodiment of the present invention in FIG. 9.
Figure 11:
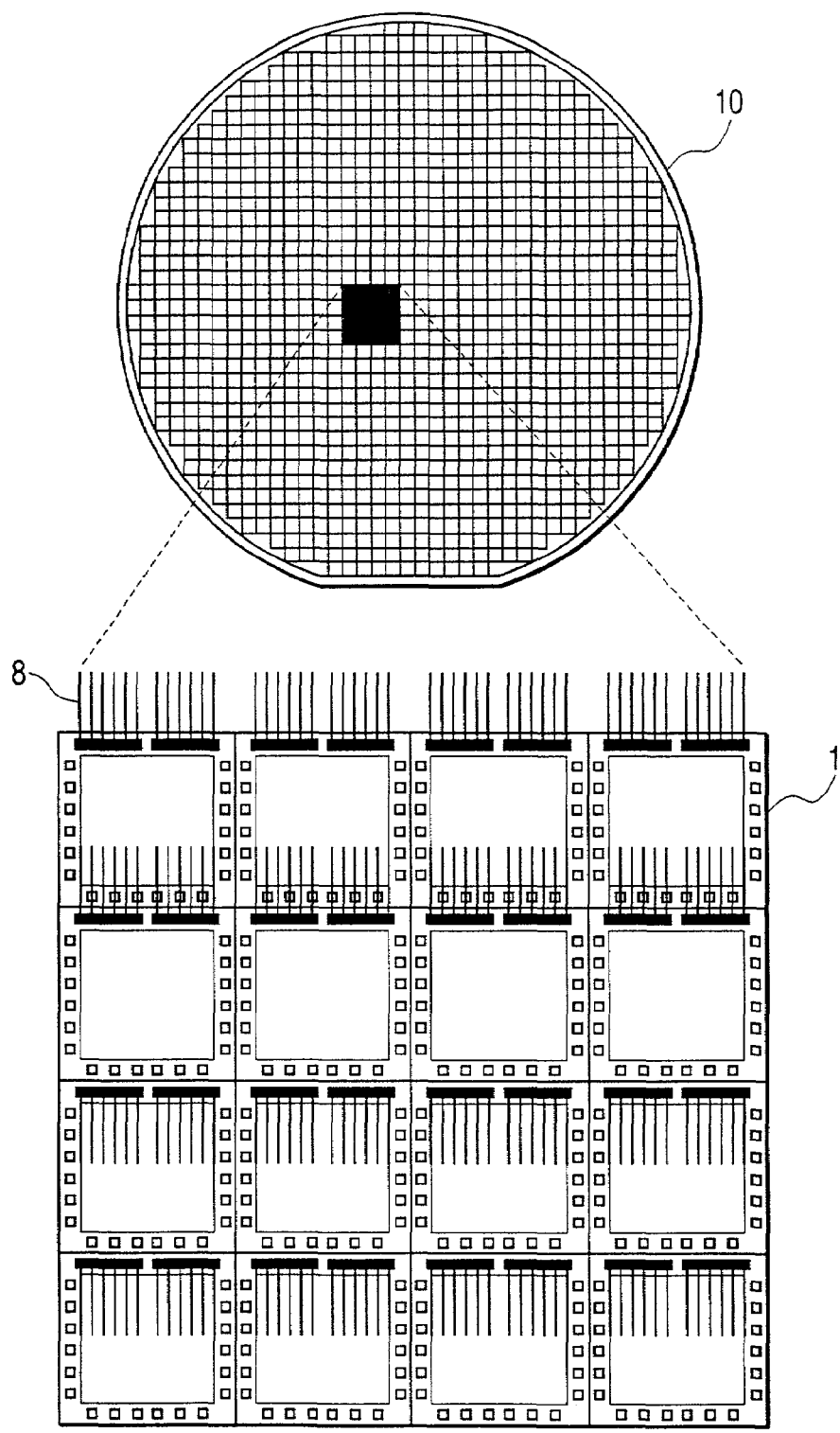
FIG. 11 shows the probing of a plurality of semiconductor integrated circuit devices at a time on a wafer in an embodiment of the present invention.

These configurations of connection wiring shown in FIGS. 5 to 8 are applied to the second embodiment of semiconductor integrated circuit device of the present invention, wherein all inspection pads are arranged along the upper side of the device (FIGS. 9 to 11). It is apparent that the semiconductor integrated circuit devices with similar configurations of connection wiring and a similar arrangement of inspection pads are combined fall into the scope of this invention.

Figure 5:
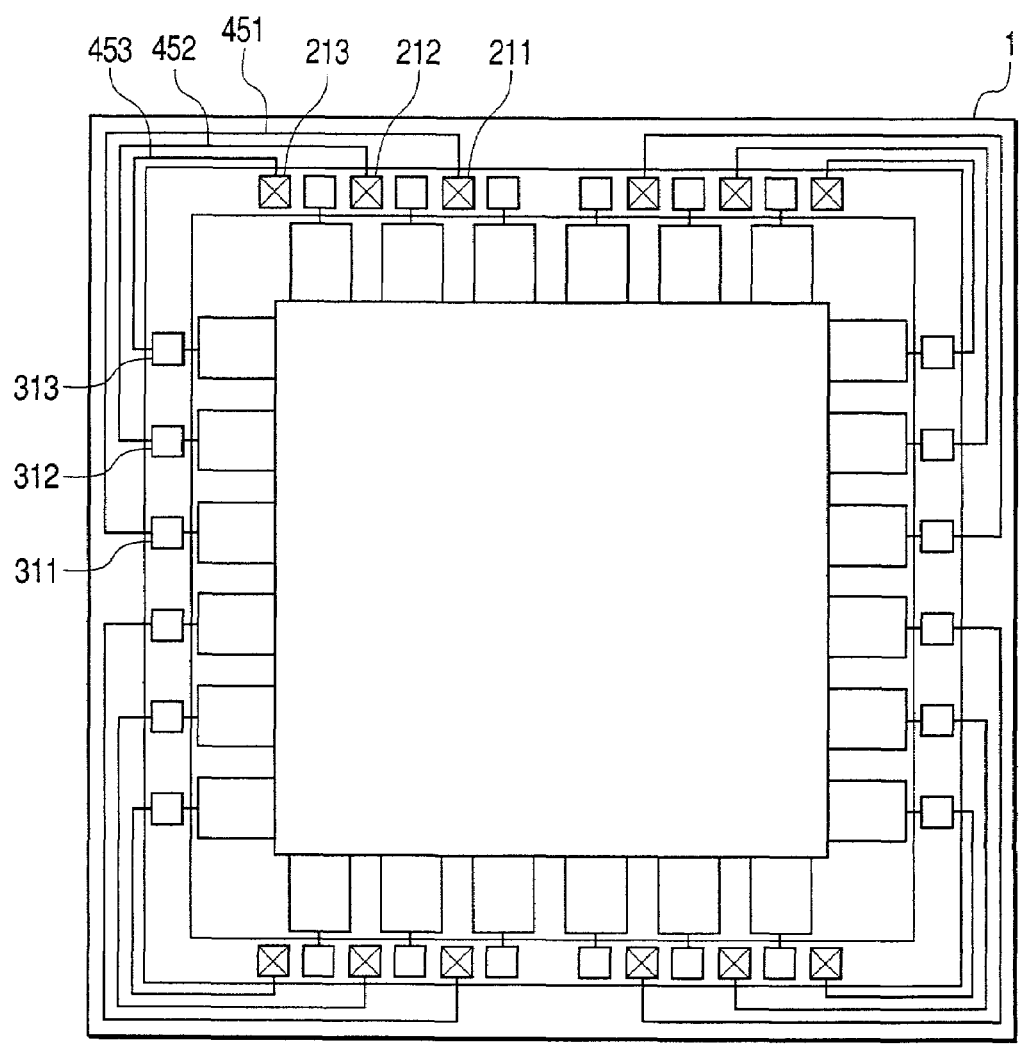
FIG. 5 shows an example of connection wiring in the semiconductor integrated circuit device of the first embodiment of the present invention where the bonding pads are connected to the inspection pads by connection wires of the same length.

FIG. 5 shows an example where the bonding pads are connected to the inspection pads by connection wires of the same length. In FIG. 5, the bonding pad 313 is connected to the inspection pad 211 by a connection wire 451, the bonding pad 312 is connected to the inspection pad 212 by a connection wire 452, and the bonding pad 311 is connected to the inspection pad 213 by a connection wire 453 with the three connection wires 451, 452, and 453 having the same length.

With the connection wiring shown in FIG. 5, dispersion of the electric characteristics (wiring capacity, wiring resistance, etc.) among the connection wires is reduced.

Next described is an example where connection wires between the bonding pads and the inspection pads are laid in the scribing area of the semiconductor integrated circuit device 1.

In FIG. 6, the connection wires between the bonding pads and the inspection pads are laid in the scribing area 11x and 11y of the semiconductor integrated circuit device 1. Although both the bonding pads and the inspection pads are arranged within the semiconductor integrated circuit device 1, the connection wires between the bonding and inspection pads are laid in the scribing area 11x and 11y. In FIG. 6, the bonding pad 311 is connected to the inspection pad 211 by a connection wire 461, the bonding pad 312 is connected to the inspection pad 212 by a connection wire 462, and the bonding pad 313 is connected to the inspection pad 213 by a connection wire 463.

With the above configuration, the connection wires are to be removed from each semiconductor integrated circuit device 1 by cutting the wafer in the scribing area 11x and 11y into individual devices 1.

Next described is another example where connection wires between the bonding pads and the inspection pads are laid in the scribing area of the semiconductor integrated circuit device 1.

Figure 7:
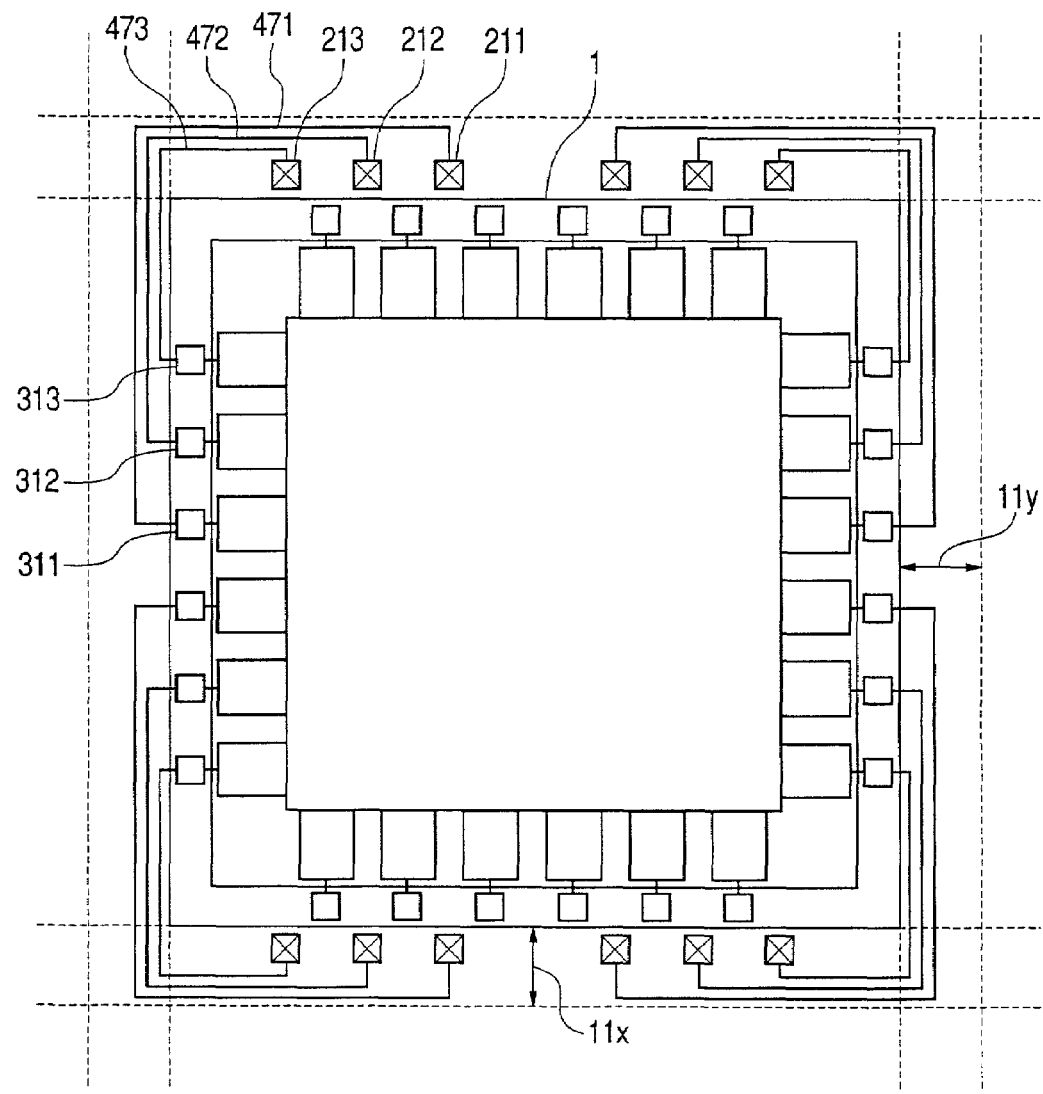
FIG. 7 shows another example where the inspection pads and the connection wires between pads are provided in the scribing area of the semiconductor integrated circuit device of the first embodiment of the present invention in FIG. 1.

In FIG. 7, the inspection pads are arranged in the scribing area outside the upper and lower sides of the semiconductor integrated circuit device 1, and also the connection wires between the bonding and inspection pads are laid in the scribing area of the device 1. In FIG. 7, the inspection pads and the bonding pads on the upper and lower sides of the semiconductor integrated circuit device 1 are arranged in zigzag. As an example of concrete connection between pads, the bonding pad 311 is connected to the inspection pad 211 by a connection wire 471, the bonding pad 312 is connected to the inspection pad 212 by a connection wire 472, and the bonding pad 313 is connected to the inspection pad 213 by a connection wire 473.

Figure 8:
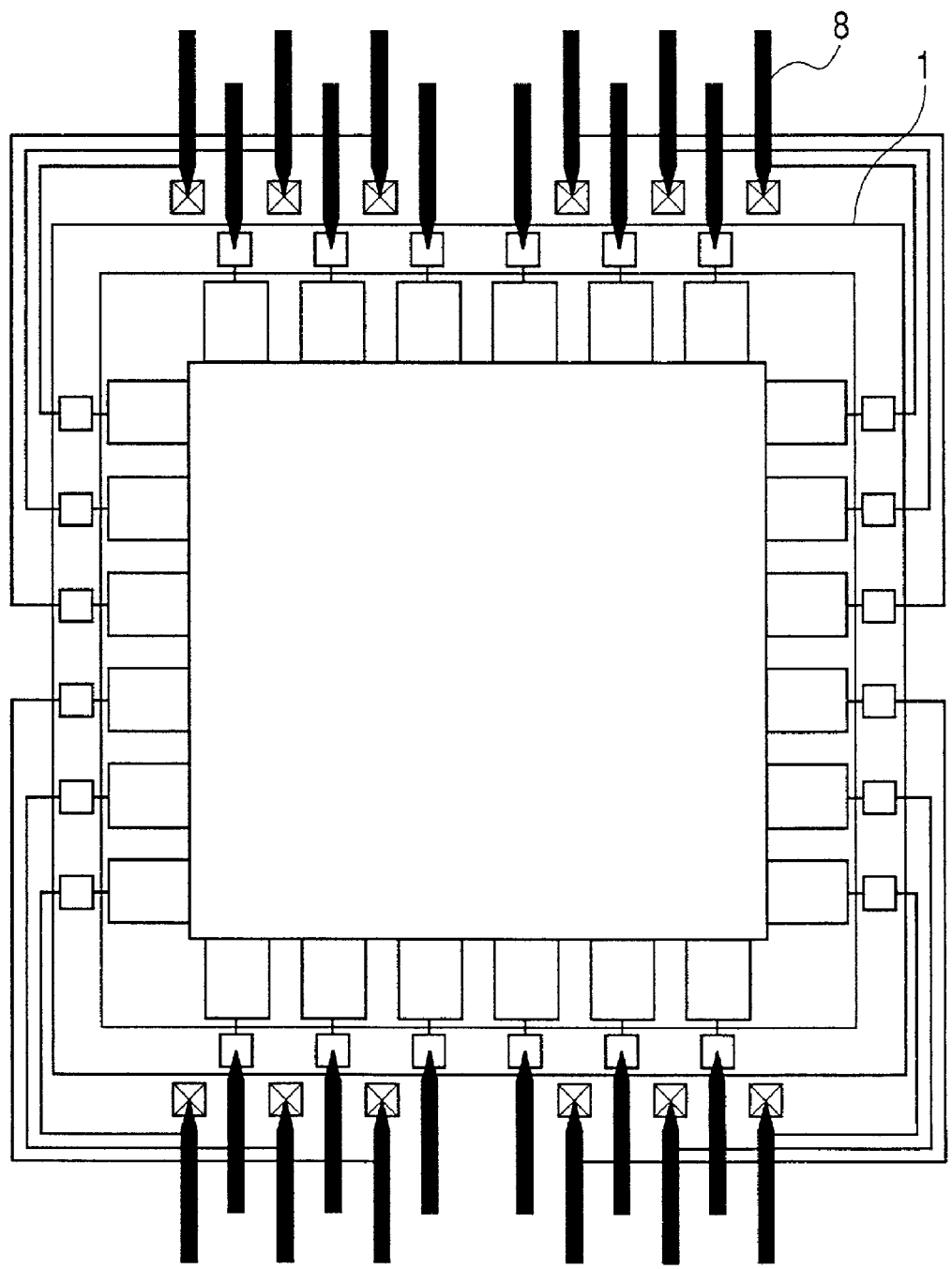
FIG. 8 shows how probe needles are applied during the inspection when the inspection pads and the connection wires between pads are provided in the scribing area of the semiconductor integrated circuit device of the first embodiment of the present invention in FIG. 7.

As described above, because the inspection pads and the bonding pads are arranged in zigzag, the probe needles 8 can easily be put onto the pads without interfering with each other as shown in FIG. 8.

With the above configuration, the inspection pads and the connection wires connecting the bonding pads to their respective inspection pads are removed from semiconductor integrated circuit devices 1 by cutting the wafer in the scribing area into individual devices 1.

Second Embodiment

Referring to FIGS. 9, 10, and 11, another embodiment of semiconductor integrated circuit device wherein inspection pads are arranged along one side of the semiconductor integrated circuit device are described below.

FIG. 9 shows the connection wiring between bonding pads and inspection pads, while the latter arranged along one side of the semiconductor integrated circuit device 1.

As shown in FIG. 9, the bonding pads (six pads, each indicated by an empty box, along each side) and the inspection pads (six pads, each indicated by a box with an X inside, along the upper side alone) are arranged in the pad area 2. The semiconductor integrated circuit device 1 is characterized by the inspection pads which are arranged along the upper side alone. The semiconductor integrated circuit device 1 is inspected by putting the tips of twelve probe needles onto the twelve pads (six bonding pads and six inspection pads) along the upper side of the device 1. The connection wires connecting the bonding pads along the sides other than the upper side to the inspection pads along the upper side are laid not only outside the pad area 2 but also through the input and output buffer area 3 and the internal logic area 5. In the example of the connection wiring shown in FIG. 9, the bonding pad 312 is connected to the inspection pad 212 by a connection wire 492, the bonding pad 313 is connected to the inspection pad 211 by a connection wire 491, the bonding pad 324 is connected to the inspection pad 213 by a connection wire 493, and all the connection wires laid outside the pad area 2. The bonding pad 325 is connected to the inspection pad 225 by a connection wire 495 laid through the input and output buffer area 3 and the internal logic area 5. With the above configuration, the probing by applying probe needles 8 to the inspection pads 212, 211, 213, 225, etc. along the upper side of the semiconductor integrated circuit device 1 is equivalent to the probing by applying probe needles 8 to the bonding pads 312, 313, 324, 325, etc. along the three sides other than the upper one.

FIG. 10 shows the probing of the semiconductor integrated circuit device 1, twelve probe needles 8 applied to the twelve pads (six bonding pads and six inspection pads) along the upper side of the device 1.

As described above, the semiconductor integrated circuit device 1 is inspected by applying twelve probe needles 8 to the upper side of the device 1. As described above, six probe needles 8 are applied to the bonding pads; the other six probes 8, to the inspection pads.

As described above, with the configuration of the present embodiment, the semiconductor integrated circuit device 1 is inspected by applying the probe needles 8 to a group of pads arranged along the upper side of the device 1.

FIG. 11 shows the probing of a plurality of semiconductor integrated circuit devices 1 at a time on a wafer.

Formed on the wafer 10 are semiconductor integrated circuit devices 1 with their pads aligned. Because each semiconductor integrated circuit device 1 has all the pads to be probed along its upper side, probe needles 8 can be arranged in four lateral straight rows as shown in FIG. 11. Sixteen semiconductor integrated circuit devices 1 (4 devices/row×4 rows) can be inspected at a time with 192 probe needles 8 (12 probe needles/device×4 devices/row×4 rows). Accordingly, all the semiconductor integrated circuit devices 1 on a wafer are inspected in one sixteenth of the time required by the prior art probing.

Referring to FIGS. 12 to 15, examples of the wiring configurations between bonding pads along the right, left, and lower sides and inspection pads on the upper side of the semiconductor integrated circuit device 1 are described.

These configurations of the connection wiring shown in FIGS. 12 to 15 can be applied to the first embodiment of semiconductor integrated circuit device of the present invention with inspection pads arranged along the upper and lower sides of the device (FIGS. 1 to 4). It is apparent that semiconductor integrated circuit devices with similar configurations of connection wiring and a similar arrangement of inspection pads are within the scope of this invention.

Figure 12:
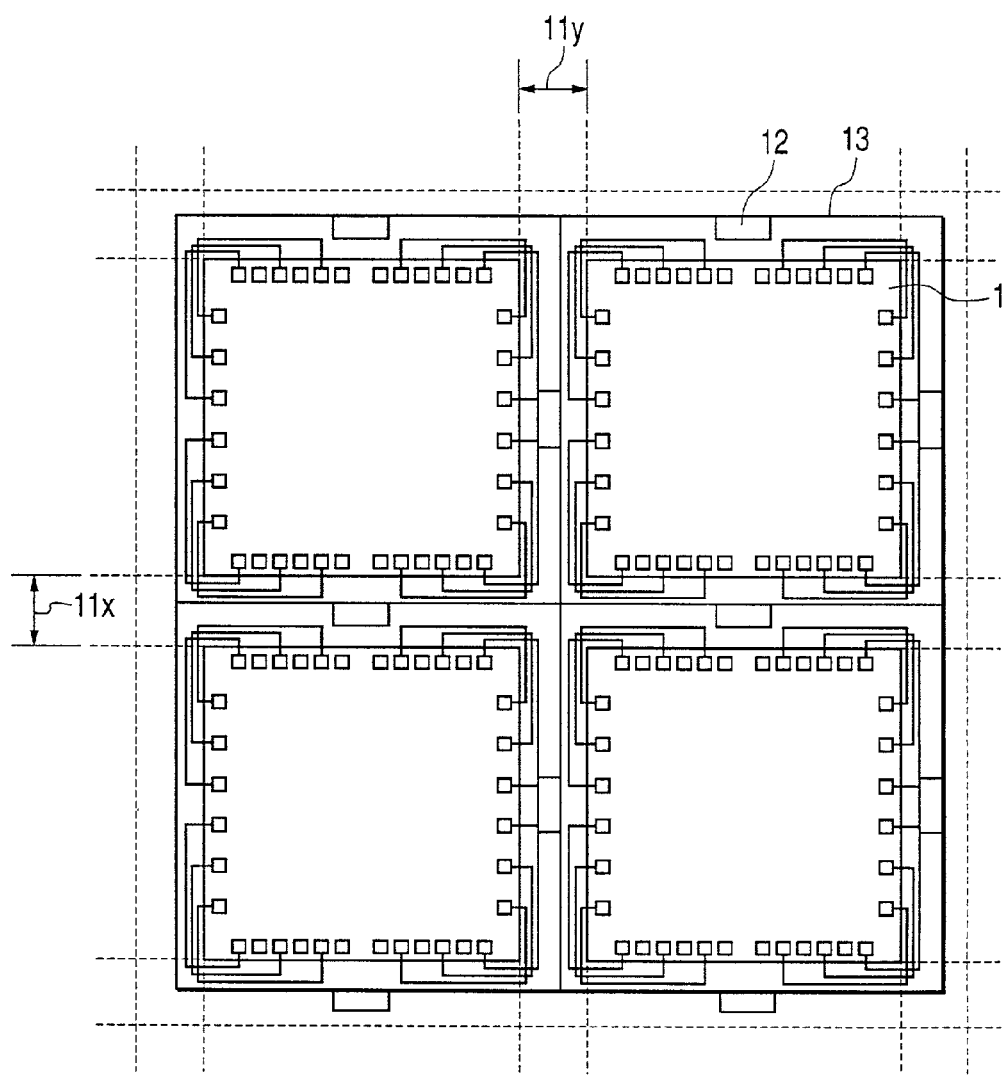
FIG. 12 shows a photomask and TEGs of which the connection wires between the pads are laid in the scribing area in the second embodiment of the present invention in FIG. 9.

FIG. 12 shows a photo mask and TEGs for semiconductor integrated circuit devices 1 of which the wires (signal lines) between the bonding pads and the inspection pads are laid in the scribing area. In general, twelve signal monitoring elements, or TEGs, are arranged on the wafer for the evaluating the quality of semiconductor integrated circuit devices and so on. In FIG. 12, TEGs 12 are arranged in the scribing area 11x and 11y.

As described above, if the wires connecting bonding pads to inspection pads are laid in the scribing area, the space for mounting TEGs has to be considered. However, if TEGs are, for example, gate devices which do not reach the upper wiring layer, wires may be laid above TEGs in the wiring layer, because the wires do not interfere with the TEGs in layout.

Besides, a photomask 13 may contain a set or sets of semiconductor integrated circuit devices 1. The wires are laid in the scribing area 11x and 11y, and TEGs 12 to raise the manufacturing efficiency. The photomask shown in FIG. 12 contains four sets.

Figure 13:
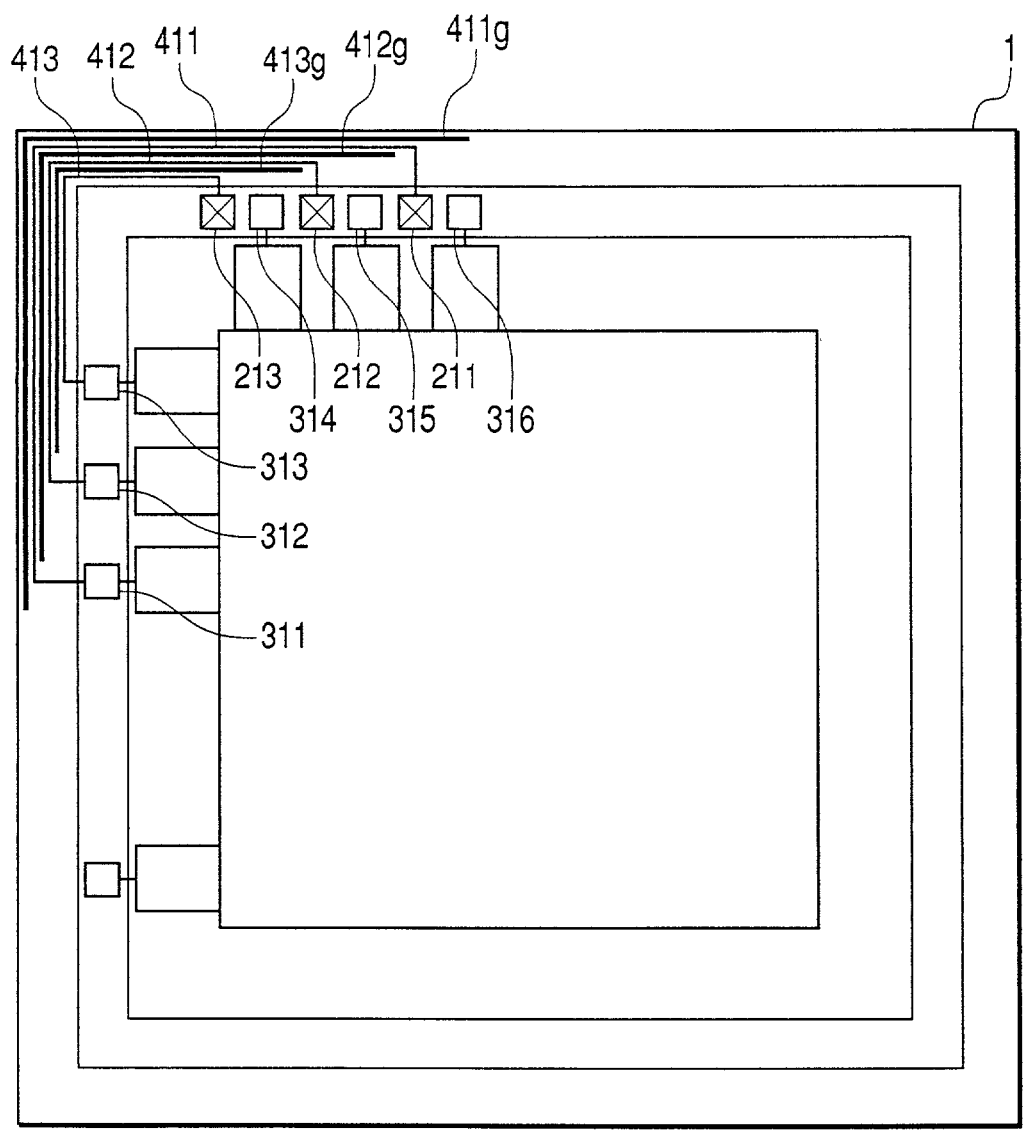
FIG. 13 shows an example of GND lines laid between connection wires (signal lines) for connecting bonding pads to inspection pads in the semiconductor integrated circuit device of the second embodiment of the present invention in FIG. 9.
Figure 14A:
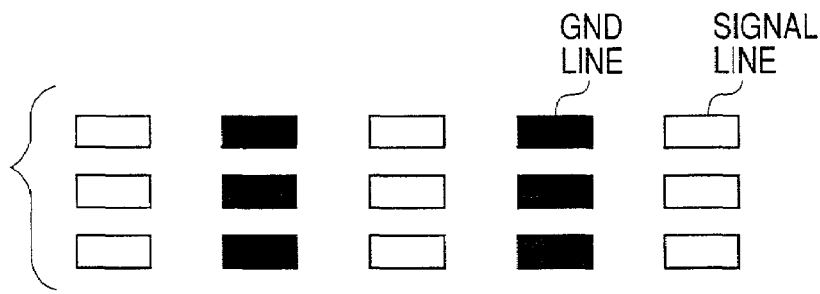
FIG. 14 shows an example of a GND layer laid between wiring (signal line) layers in the semiconductor integrated circuit device of the second embodiment of the present invention in FIG. 9.
Figure 14B:
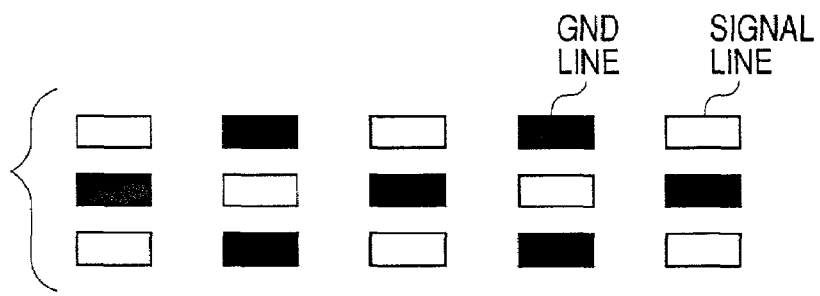
Figure 14C:
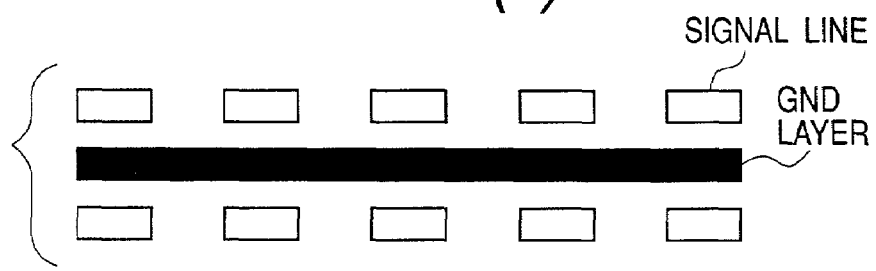
Figure 14D:
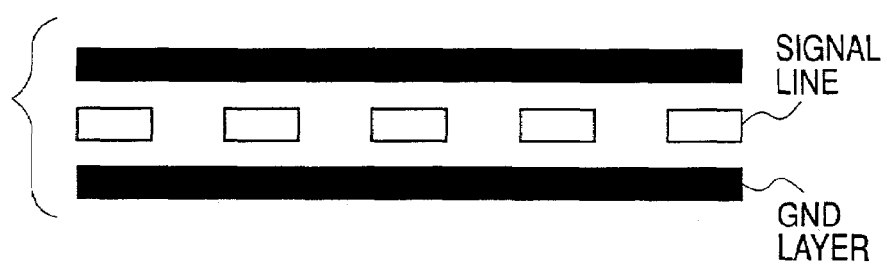

FIGS. 13 and 14 show examples of GND lines laid between wires (signal lines) for connecting bonding pads to inspection pads and an example of a GND layer laid between wiring (signal-line) layers.

FIG. 13 is a top view of the wiring of the semiconductor integrated circuit device 1. Wires (GND lines) 411g, 412g, and 413g are laid between wires (signal lines) 411, 412, and 413. With this configuration, the potential trouble (cross-talk, etc.) between the wires (signal lines) can be prevented.

FIG. 14 shows sectional views of the wiring of the semiconductor integrated circuit device 1 consisting of three wiring layers. In FIG. 14(a), wires (GND lines) are laid between wires (signal lines). In FIG. 14(b), wires (GND lines) are laid zigzag between wires (signal lines). In FIG. 14(c), a GND layer is laid between wiring (signal-line) layers. In FIG. 14(d), a wiring (signal-line) layer is formed between GND layers. With these configurations, the potential trouble (cross-talk, etc.) between wires (signal lines) can be prevented as in the case of the wiring of FIG. 13.

Figure 15:
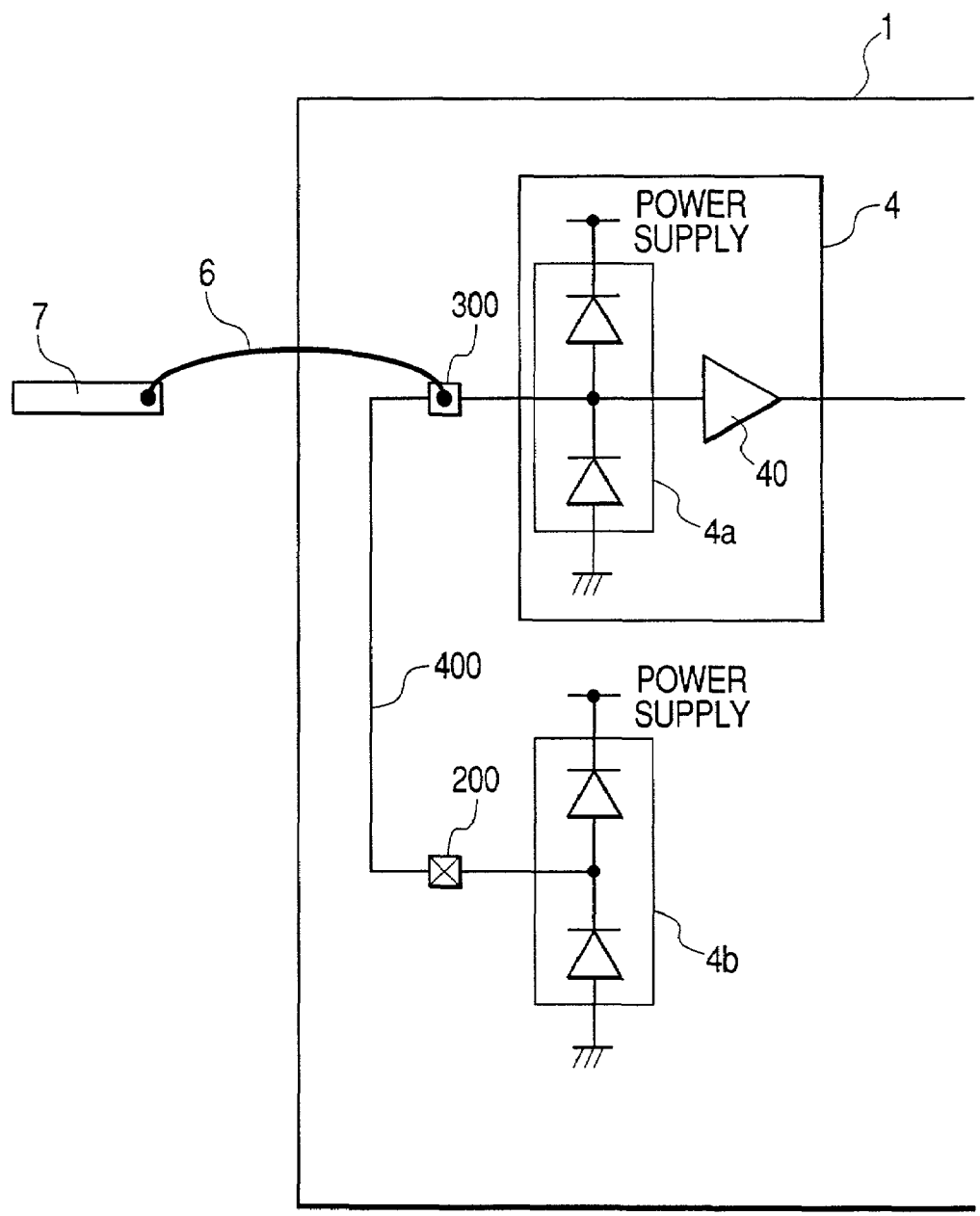
FIG. 15 shows a circuit chart of a semiconductor integrated circuit device of the second embodiment of the present invention wherein an electrostatic discharge protection element is disposed in the vicinity of an inspection pad.
Figure 16:
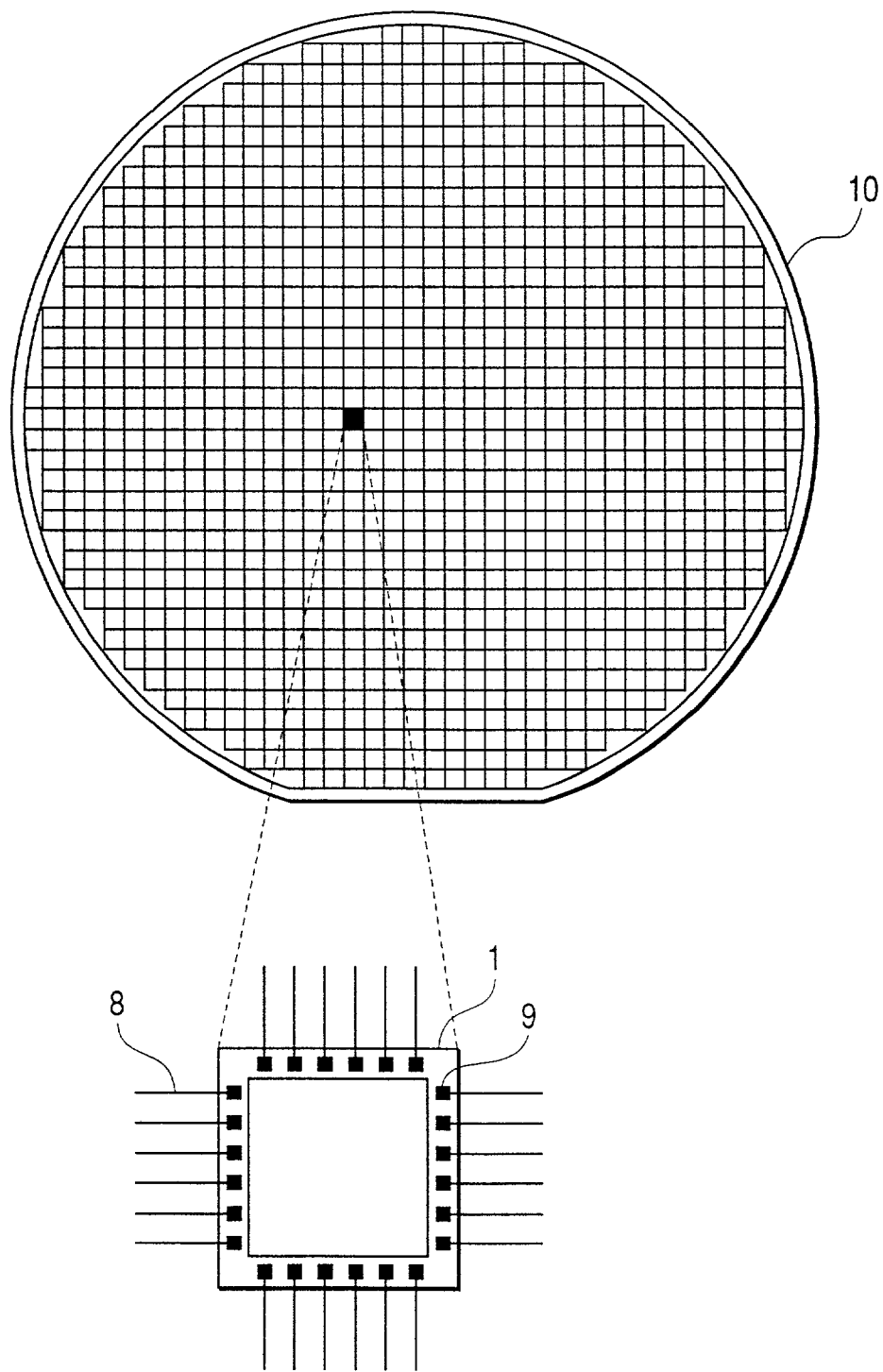
FIG. 16 shows the disposition of bonding pads in a semiconductor integrated circuit device of the conventional structure.
Figure 17:
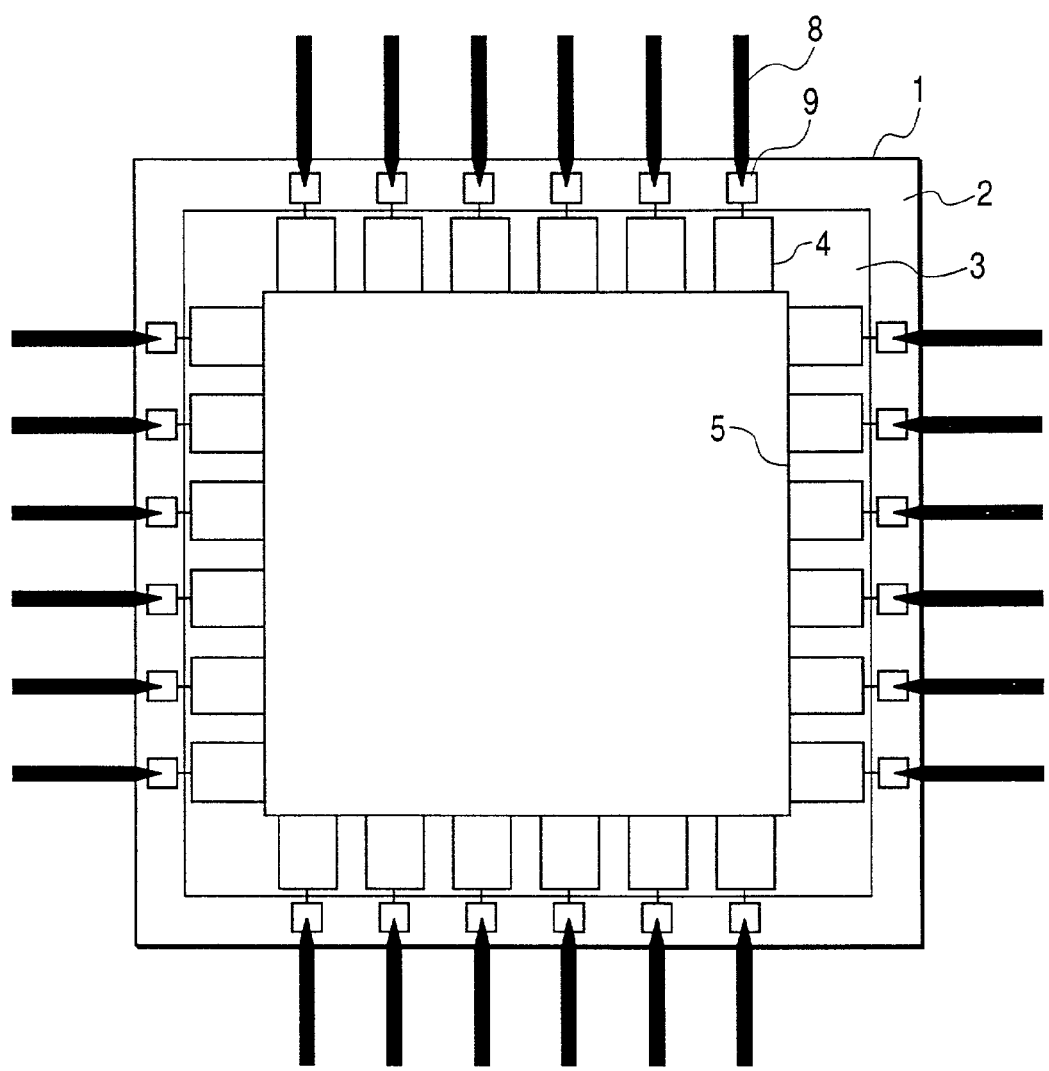
FIG. 17 shows how probe needles are applied to the bonding pads during the inspection of the semiconductor integrated circuit device of the conventional structure.
Figure 18:
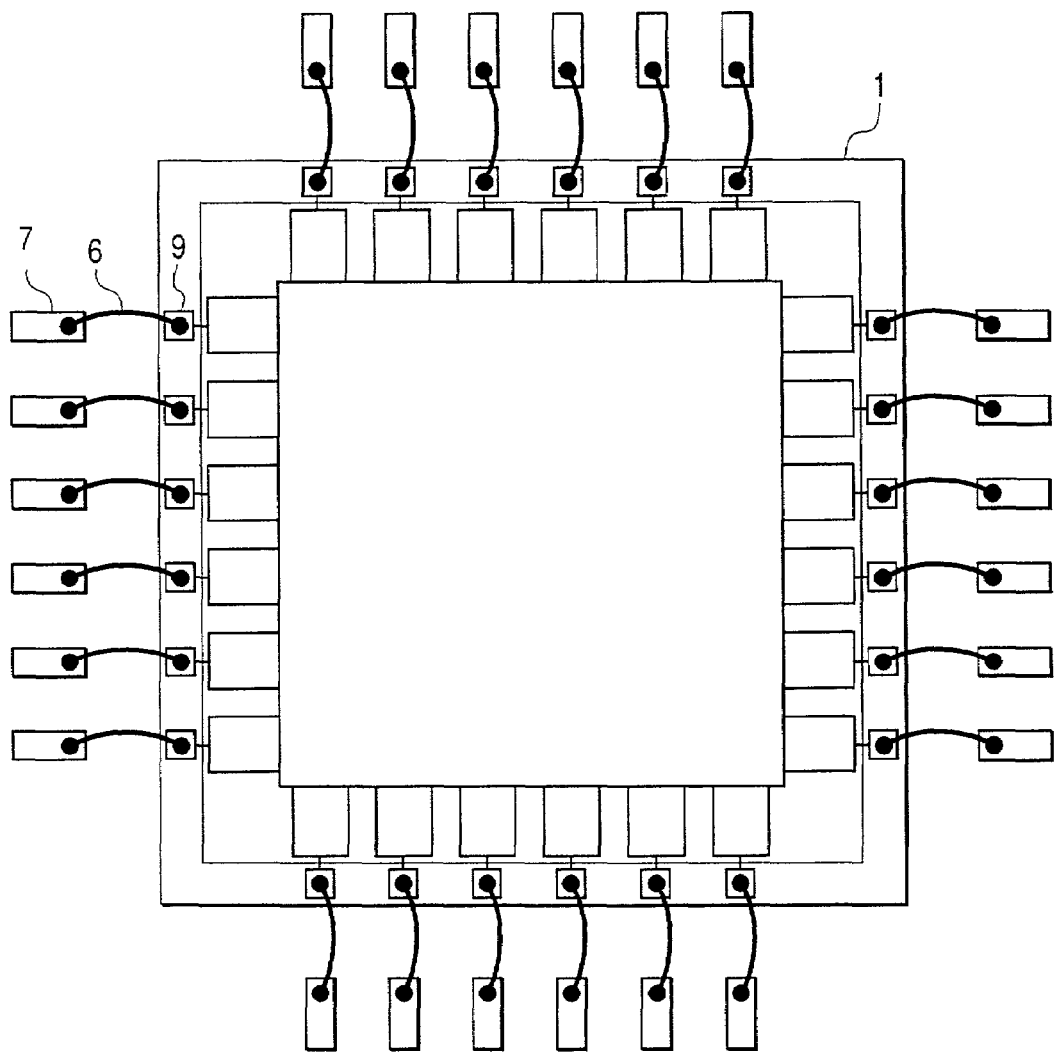
FIG. 18 shows the wire bonding of the semiconductor integrated circuit device of the conventional structure.
Figure 19A:
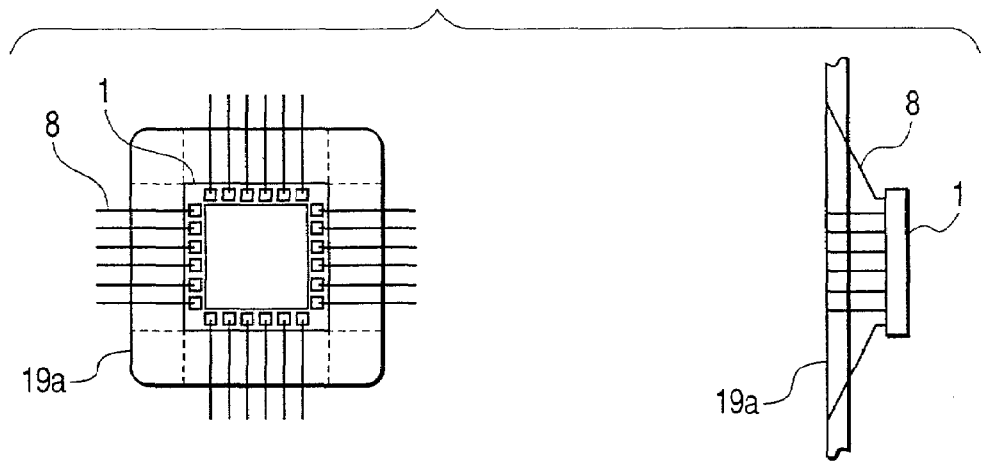
FIG. 19 shows the relative disposition of a probe card and probe needles during the inspection in a semiconductor integrated circuit device of the conventional structure.
Figure 19B:
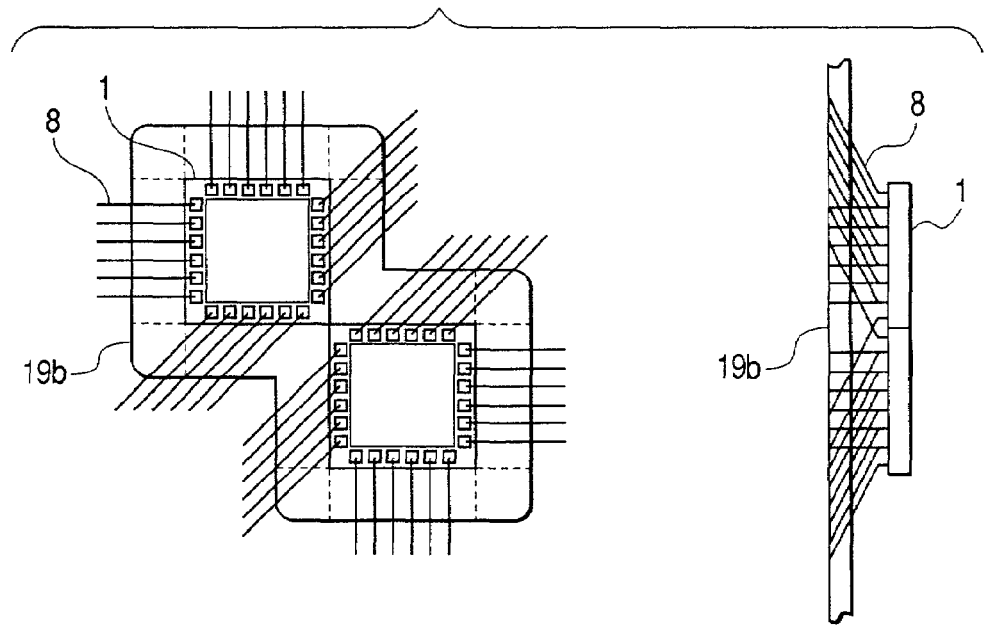
Figure 20A:
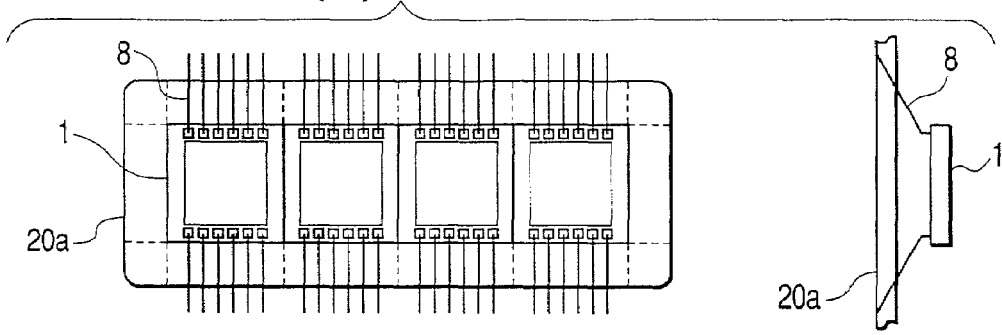
FIG. 20 shows the relative disposition of a probe card and probe needles when inspecting, at a time, a plurality of semiconductor integrated circuit devices of the conventional structure.
Figure 20B:
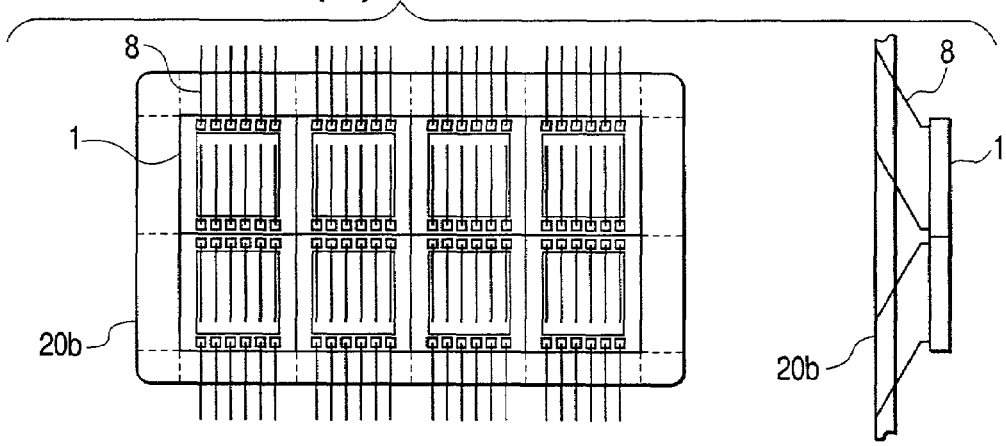
Figure 20C:
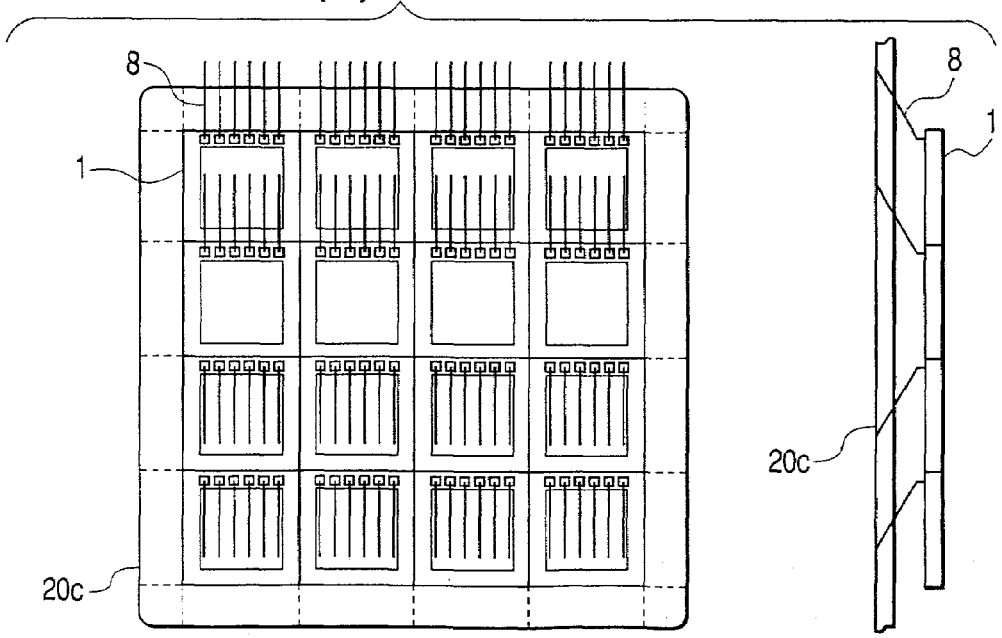

FIG. 15 shows the semiconductor integrated circuit device 1 of the present embodiment wherein an electrostatic discharge protection element is disposed in the vicinity of an inspection pad. In FIG. 15, an input buffer element 40 alone is shown within an input and output buffer 4.

Each input and output buffer 4 in the semiconductor integrated circuit device 1 consists of an input buffer element 40 and an electrostatic discharge protection element 4a. The electrostatic discharge protection element 4a passes high voltage due to static electricity, etc. through itself to the power supply or GND to prevent the destruction of the input buffer element 40. A diode may be used as the electrostatic discharge protection element 4a.

The input buffer 4 is connected to a bonding pad 300 and further to an inner lead 7 through a bonding wire 6. The bonding pad 300 is connected to an inspection pad 200 through a connection wire 400. In this example, another electrostatic discharge protection element 4b is disposed in the vicinity of the inspection pad 200 to suppress the effects of high voltage due to static electricity, etc.

Third Embodiment

According to the third embodiment of the present invention, bonding pads are arranged along two opposite sides of each semiconductor integrated circuit device 1 to facilitate the probing of a plurality of devices 1 at a time. Unlike the first and second embodiments, no inspection pads are required. However, if leads are arranged along the corresponding two opposite sides of the package, the whole size of the package may become larger. Besides, the package becomes incompatible with the package with leads along its four sides. Therefore, it is desirable to mount a semiconductor integrated circuit device with bonding pads along its two opposite sides on a package with leads along its four sides, such as a QFP (Quad Flat Package), a TQFP (Thin Quad Flat Package), or a QFN (Quad Flat High Package). According to this embodiment, a semiconductor integrated circuit device with bonding pads along its two opposite sides is mounted not only on a package with inner leads along its two opposite sides, but also on a package with inner leads along its four sides.

The minimum distance "x" between adjacent inner leads attainable by the present technology is larger than the minimum distance "y" between adjacent bonding pads attainable by the present technology. For example, "y" can be made as small as about 80 µm regardless of the restriction by the positioning precision of bounders, whereas "x" is made at least about 180 µm under the restriction by the processing precision of lead frames. The intervals between bonding pads are adjusted to match the intervals between inner leads. Accordingly, the size of a semiconductor integrated circuit device and its package is determined by the intervals between bonding pads and the number of pins, which may be an obstacle to reducing chip size of semiconductor integrated circuit devices by the micro-processing technology.

Figure 21A:
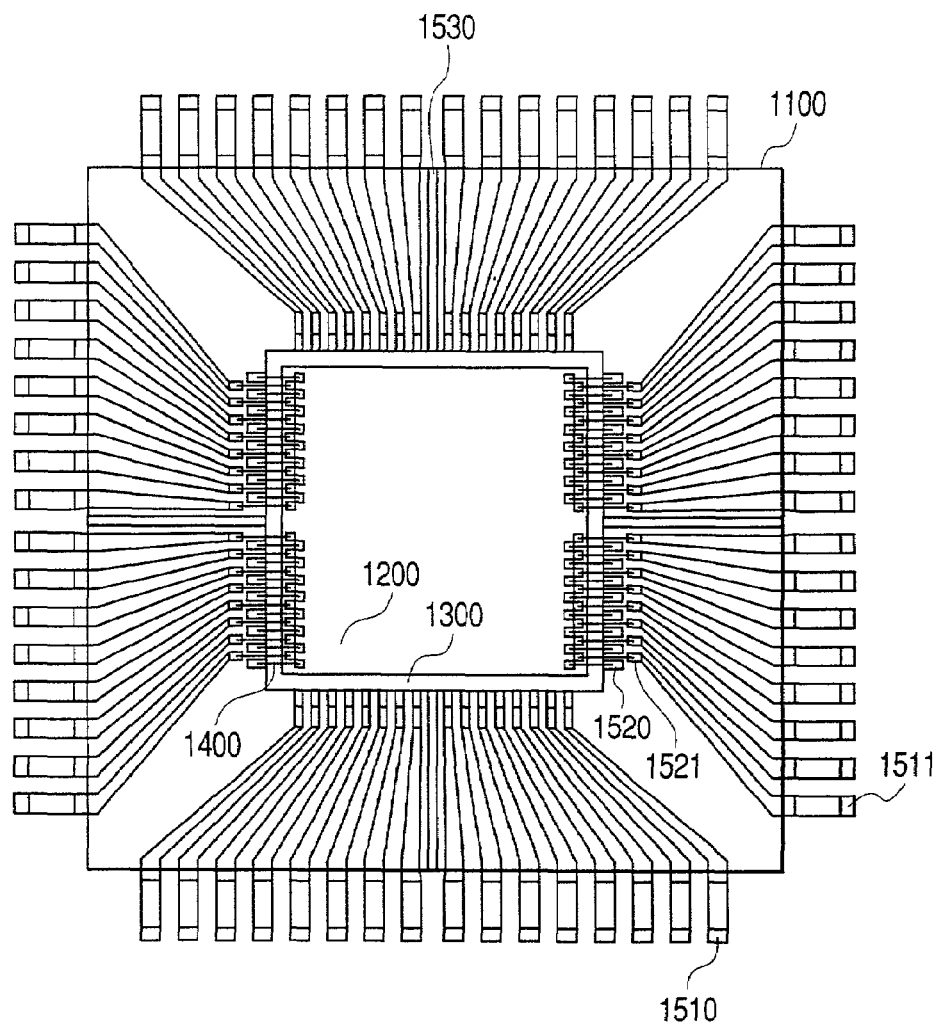
FIG. 21(a) is a top view of a package of a third embodiment (a first example of configuration) of the invention disposed with a semiconductor device.
Figure 21B:
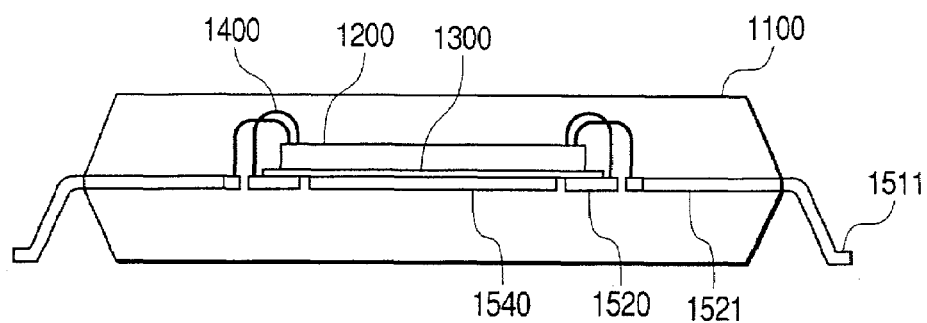
FIG. 21(b) is a cross-sectional view of the package in FIG. 21(a)
Figure 22:
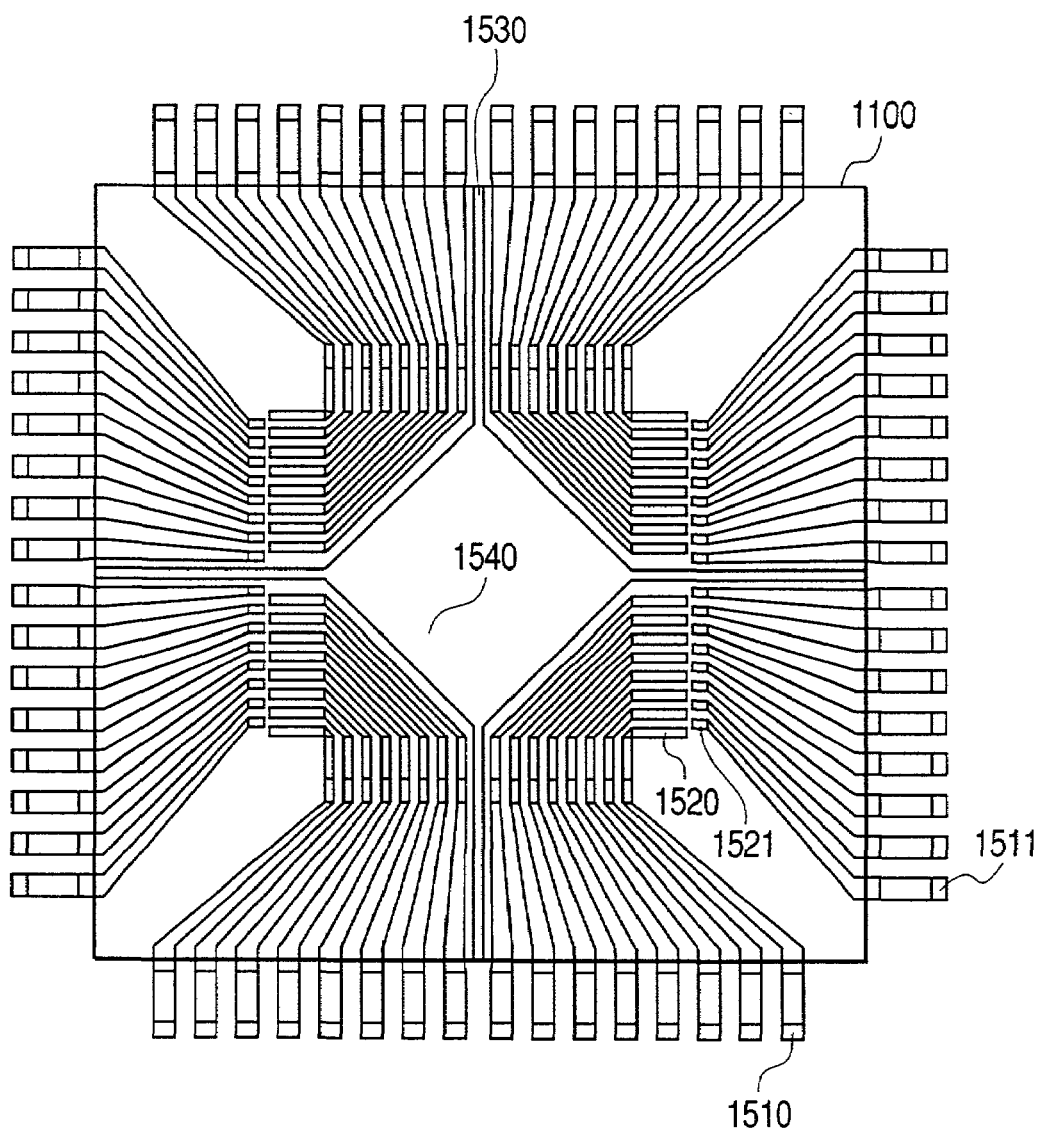
FIG. 22 is a top view of the package of FIG. 21(a) without showing the semiconductor device.
Figure 23:
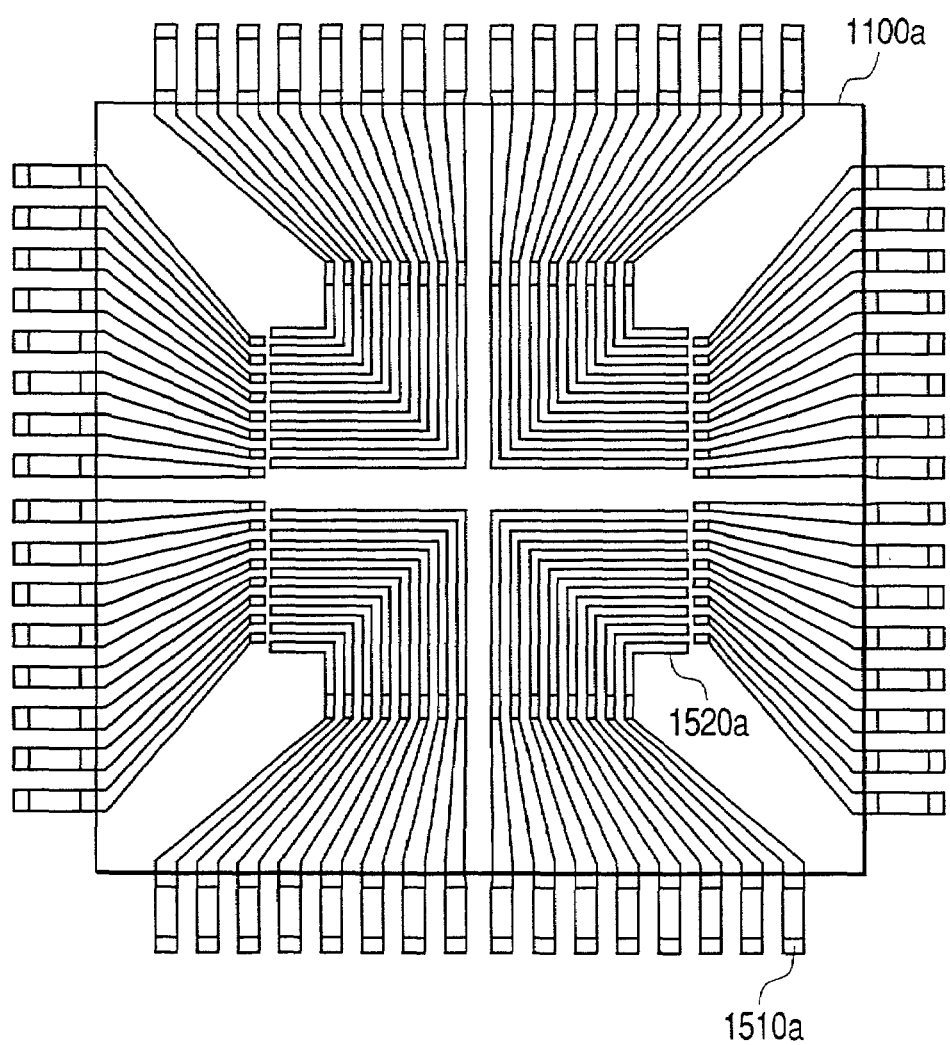
FIG. 23 illustrates a modification of the package in FIG. 22 of the third embodiment (the first example of configuration) of the invention.

Referring to FIGS. 21, 22, and 23, the first example of mounting configuration of the semiconductor integrated circuit device on a package is described.

A package 1100 comprises a semiconductor integrated circuit device 1200, a table 1540 to support the semiconductor integrated circuit device 1200, table-hanging leads 1530 to support the table 1540, an insulator 1300 to electrically insulate the semiconductor integrated circuit device 1200 from the table 1540, a plurality of outer leads 1510 and 1511 arranged outside the package 1100, a plurality of inner leads 1520 and 1521 arranged inside the package 1100, and bonding wires 1400 to connect the inner leads to the bonding pads (FIG. 22 shows the package 1100 without the semiconductor integrated circuit device 1200, the insulator 1300, and the bonding wires 1400).

The semiconductor integrated circuit device 1200 has bonding pads along its two opposite sides (along its right and left sides in FIG. 21), but no bonding pads on the other two opposite sides. The package 1100 is of a QFP type with leads arranged along its four sides. In general, if a semiconductor integrated circuit device has bonding pads along its two opposite sides and its package has leads along its four sides, the bonding wires may come into contact with each other when the inner leads are connected to the bonding pads by bonding wires.

Accordingly, in this example, the inner leads extending from the outer leads along the upper or lower sides of the package 1100 go under or above the semiconductor integrated circuit device 1200 and change their directions by 90° (two turns of 45° in FIG. 22) to protrude over the right and left sides of the semiconductor integrated circuit device 1200. With this configuration of the outer and inner leads, the inner leads 1521 extending from the outer leads 1511 along the right side of the package 1100 are connected to bonding pads along the right side of the semiconductor integrated circuit device 1200 by bonding wires. On the other hand, the inner leads 1520 extending from the outer leads 1510 along the lower side of the package 1100 and changing their directions by 90° are connected to bonding pads along the right side of the semiconductor integrated circuit device 1200 by bonding wires 1400.

Besides, the front ends of the inner leads 1520 and the front ends of the inner leads 1521 are arranged zigzag. Because the attainable minimum intervals between bonding pads are smaller than those between inner leads, the zigzag arrangement of inner leads reduces the intervals between them to about one half.

Since a plurality of inner leads are disposed under the semiconductor integrated circuit device 1200, they also mechanically function as a table for supporting the semiconductor integrated circuit device 1200. Electrically, it is completely insulated by the insulator 1300.

Further, as in the example of FIG. 21, corresponding to inner leads arranged zigzag, the bonding pads of the semiconductor integrated circuit device are also arranged zigzag. Thus, length of each bonding wire 1400 advantageously is almost the same.

FIG. 23 shows another example of the lead frame. The inner leads 1520*a* extend from the outer leads 1510*a* along the lower side of the package 1100*a*, go under a central portion of the package and change their directions by 90°. Accordingly, the inner leads 1520*a* also mechanically function as a table. Further, electrically, as in the configuration of FIG. 21, it is completely insulated from the semiconductor integrated circuit device by an insulator provided therebetween.

As described above, the lead frame shown in the present embodiment makes it possible to mount a semiconductor integrated circuit device having bonding pads along two opposite sides on a package with leads along four sides.

Further, since the bonding pads are provided along two opposite sides alone of the semiconductor integrated circuit device, there are no bonding pads existing on the other two sides. Therefore, there is also no need to provide I/O buffers on the other two sides. Accordingly, area to be occupied by the I/O buffers is reduced, which allows the semiconductor integrated circuit device more to become compact.

Figure 24:
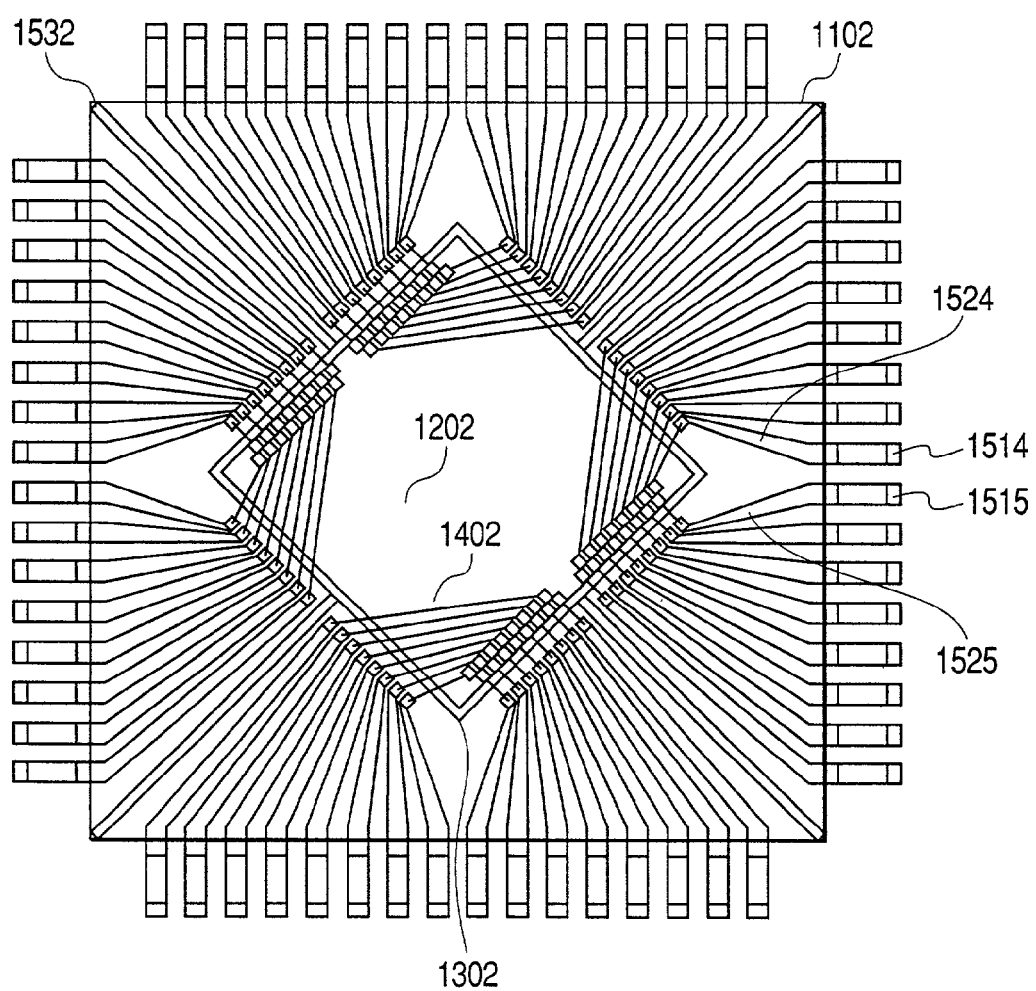
FIG. 24 illustrates a package of the third embodiment (a second example of configuration) of the invention disposed with a semiconductor device.
Figure 25:
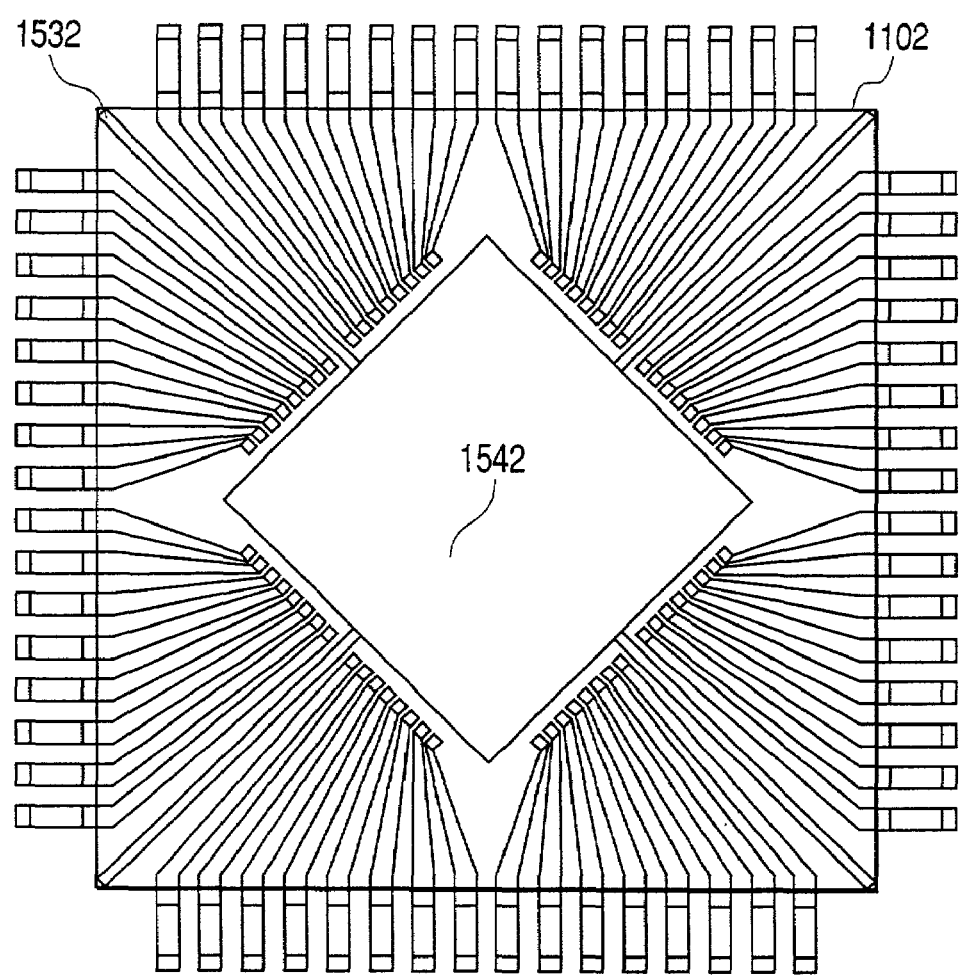
FIG. 25 illustrates the package of FIG. 24 without showing the semiconductor device.

Referring to FIGS. 24 and 25, the second example of the third embodiment of the invention is described.

A package 1102 comprises a semiconductor integrated circuit device 1202, a table 1542 to support the semiconductor integrated circuit device 1202, table-hanging leads 1532 to support the table 1542, an insulator 1302 to electrically insulate the semiconductor integrated circuit device 1202 from the table 1542, a plurality of outer leads 1514 and 1515 arranged outside the package, a plurality of inner leads 1524 and 1525 arranged inside the package, and bonding wires 1402 for connecting the inner leads to the bonding pads (FIG. 25 shows the package 1102 without the semiconductor integrated circuit device 1202, the insulator 1302 and the bonding wires 1402).

The second example is so configured as to mount the semiconductor integrated circuit device 1202 by tilting it at an angle of 45° with respect to the package 1102. The semiconductor integrated circuit device 1202 has bonding pads along its two opposite sides (along a side on the upper left and a side on the lower right in the figure), but no bonding pads on the other two opposite sides. Accordingly, the lead frame is simply configured as shown in the figure, and connected to the bonding pads of the semiconductor integrated circuit device by bonding wires.

Specifically, it is possible to route (1) the bonding wires connecting inner leads 1524, which extend from the outer leads 1514 on a right side of the package 1102 to the bonding pads on the lower right side of the semiconductor integrated circuit device, and (2) the bonding wires connecting inner leads 1525 which extend from the outer leads 1515 on a right side of the package 1102 to the bonding pads on the lower right side of the semiconductor integrated circuit device, without having them contact with each other. To prevent the bonding wires from contacting with each other, the bonding pads of the semiconductor integrated circuit device are arranged zigzag.

In the figures, an example of the semiconductor integrated circuit device tilted at 45° is shown. However, arrangement may be made an angle other than 45°.

Figure 26:
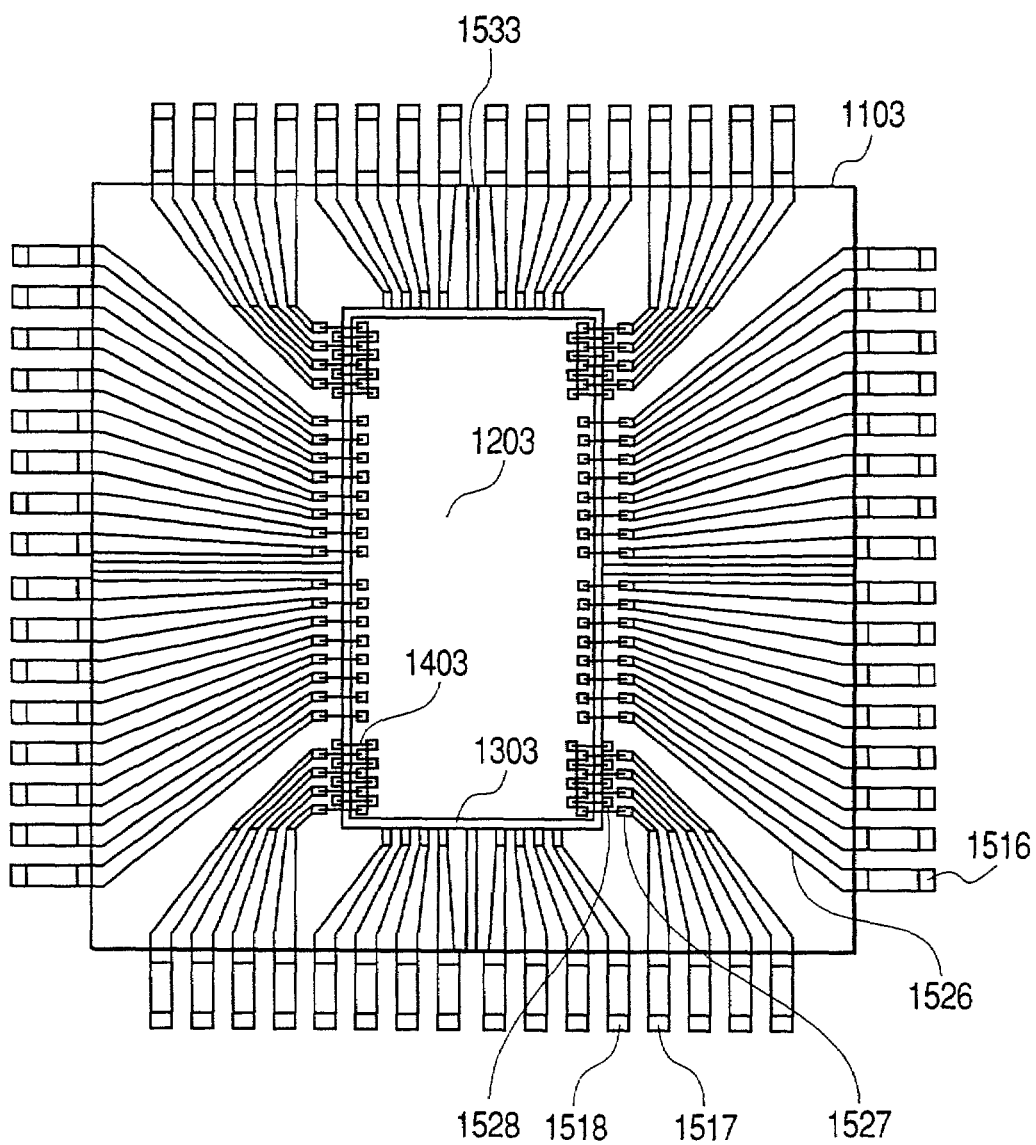
FIG. 26 illustrates a package of the third embodiment (a third example of configuration) of the invention disposed with a semiconductor device.
Figure 27:
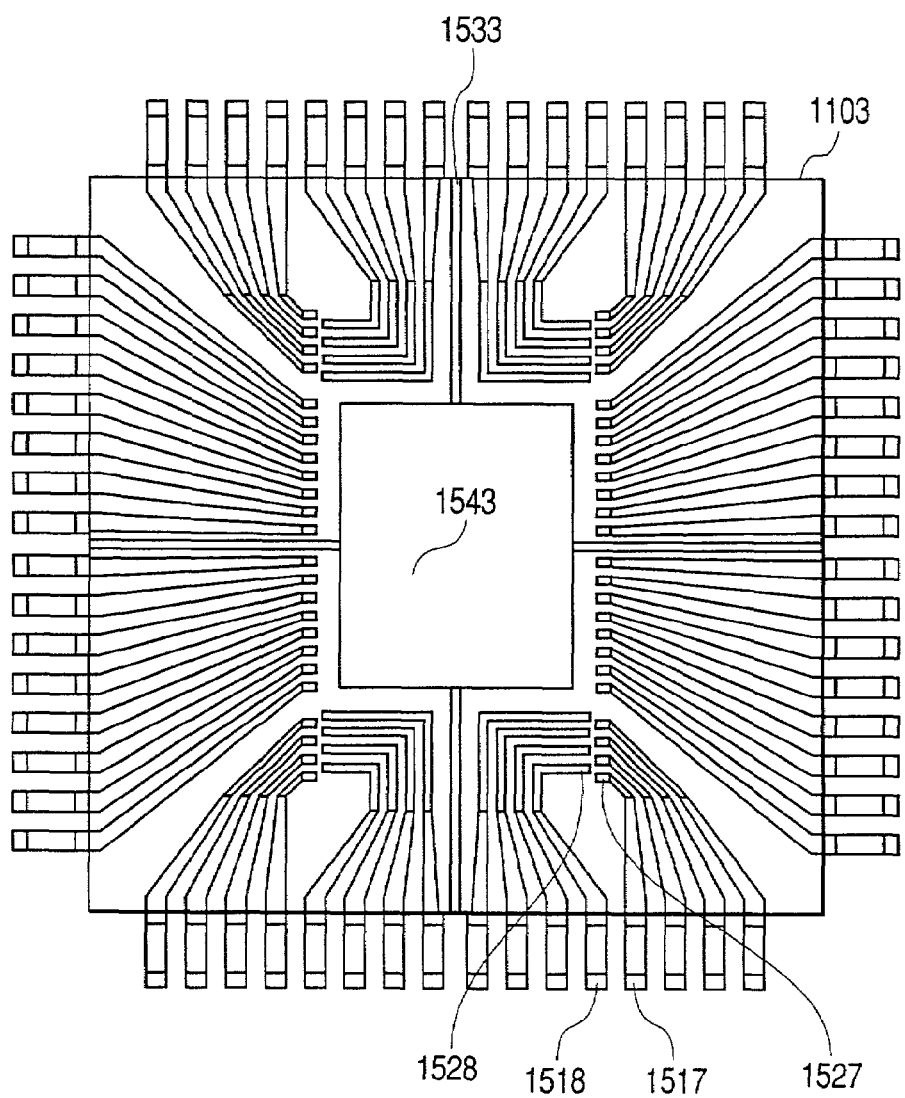
FIG. 27 illustrates the package in FIG. 26 without showing the semiconductor device.

Referring to FIGS. 26 and 27, the third example of the third embodiment of the invention is described.

The package 1103 comprises a semiconductor integrated circuit device 1203, a table 1543 to support the semiconductor integrated circuit device 1203, table-handing leads 1533 to support the table 1543, an insulator 1303 to electrically insulate the semiconductor integrated circuit device 1203 from the table 1543, a plurality of outer leads 1516, 1517 and 1518 arranged outside the package, a plurality of inner leads 1526, 1527 and 1528 arranged inside the package, and bonding wires 1403 to connect the inner leads to the bonding pads (FIG. 27 shows the package 1103 without the semiconductor integrated circuit device 1203, the insulator 1303, and the bonding wires 1403).

The semiconductor integrated circuit device 1203 is of a rectangle shape whose two longer sides are provided with bonding pads. The bonding pads are provided on the opposing longer sides (right and left sides in the figure) of the semiconductor integrated circuit device 1203 but not on the remaining two shorter sides (upper and lower sides in the figure). Further, along the right and left sides, bonding pads are arranged in a row at a middle section and zigzag into two rows on the upper end and lower end as shown in FIG. 26.

Specifically, inner leads 1526 extending from the outer leads 1516 on the right side of the package 1103 and bonding pads at the middle section of the right side of the semiconductor integrated circuit device 1203, inner leads 1527 extending from the outer leads 1517 on the lower side of the package 1103 and bonding pads at the lower end on the right side of the semiconductor integrated circuit device 1203, and inner leads 1528 extending from the outer leads 1518 on the lower side of the package 1103 and being bent to the right at an angle of 90° with respect to bonding pads at the lower end on the right side of the semiconductor integrated circuit device 1203.

According to the lead frame shown in the above embodiment, the semiconductor integrated circuit device with the bonding pads provided along two opposite sides is mounted on a package being in the shape generally referred as a QFP, which has leads arranged along the four sides. But unlike in conventional devices, there is no need to provide bonding pads along four sides of the semiconductor integrated circuit device according to the invention. It is easier to make the probing by providing bonding pads along only two sides of the semiconductor integrated circuit device.

The present invention provides a semiconductor integrated circuit device in which (i) inspection pads are arranged along one side or two opposite sides of the semiconductor integrated circuit device to be connected to bonding pads arranged along the sides other than the side or the two opposite sides; and (ii) the bonding pads along the sides other than the side or the two opposite sides are connected to their respective inspection pads by connection wires. Therefore, positions to which probe needles are applied during probing are limited to the one or two opposite sides. Also, a plurality of the above semiconductor integrated circuit devices are arranged on a wafer so as to arrange the sides with the inspection pads in one straight line or parallel straight lines. Therefore, it is easy to make the probe needles applied to a plurality of semiconductor integrated circuit devices on the same probe card. Accordingly, the plurality of semiconductor integrated circuit devices on a wafer with probe needles can easily be inspected at a time.

In the case of inspection on two sides of the device, for example, when eight devices are inspected at a time, the inspection time per wafer is reduced to one eighth of what is required in the prior art. Further, in the case of inspection on one side of the device, for example, when sixteen devices are inspected at a time, the inspection time per wafer is reduced to one sixteenth of what is required in the prior art. The invention considerably lowers inspection cost.

Further, in the semiconductor integrated circuit device of the present invention, when extending connection wires to one side or two opposite sides of the device from the bonding pads on the other sides, the wiring can be made without impacting the layout of the input-output buffer area and the internal logic area by routing the wires outside the above bonding pads and the inspection pads. On the other hand, the wiring may be routed inside the bonding pads and inspection pads to shorten the wiring length.

Further, in the semiconductor integrated circuit device of the present invention, when extending connection wires to one side or two opposite sides of the device from the bonding pads on the other sides, dispersion of the electrical characteristics among the wires is reduced by providing connection wires of the same length.

Also, in the semiconductor integrated circuit device of the present invention, the inspection pads and the connection wires connecting the bonding pads along the sides other than the side or the two opposite sides with the inspection pads to their respective inspection pads are laid in a scribing area, and the inspection pads and the bonding pads along the side or the two opposite sides with the inspection pads are arranged zigzag such that the inspection pads and the connection wires are to be removed from the semiconductor integrated circuit device when the semiconductor integrated circuit device is cut off the wafer at the scribing area after the semiconductor integrated circuit device is inspected with probe needles. Thus, since the above inspection pads and the above connection wires are not left in the semiconductor integrated circuit device after the disconnection (scribing), they have no influence on any measurement of electrical characteristics during a selection in an assembly process.

Also, in the semiconductor integrated circuit device of the present invention, the connection wires connecting the above inspection pads and the corresponding bonding pads are provided in a single or a plurality of wiring layer(s), and GND lines or a GND layer is laid between wires or the wiring layers. With these configurations, probable trouble (cross-talk, etc.) between neighboring wires in the prior art is prevented.

Further, in the semiconductor integrated circuit device of the present invention, when extending connection wires to one side or two opposite sides of the device are provided from the bonding pads, an electrostatic discharge protection element is disposed in the vicinity of an inspection pad. Thus, together with the electrostatic discharge protection element provided in the input-output buffer on the bonding pad side, the effect of preventing the inner circuit, including the input-output buffer, from being destroyed by high voltage generated by electrostatic discharge, etc. is obtained.

The principles, preferred embodiments and modes of operation of the present invention have been described in the foregoing specification. However, the invention which is intended to be protected is not limited to the particular embodiments disclosed. The embodiments described herein are illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A semiconductor integrated circuit device comprising:
a semiconductor chip embedded in the semiconductor integrated circuit device, the semiconductor chip comprising:
   a first bonding pad arranged on a first side of the semiconductor chip;
   a second bonding pad arranged on a second side of the semiconductor chip;
   a first input and output buffer and a second input and output buffer which are coupled to the first and second bonding pads respectively;
   a first inspection pad;
   a first connecting wire which is laid outside an area where the first and second input and output buffers are arranged and which connects the second bonding pad to the first inspection pad;
   a plurality of other first bonding pads arranged on the first side of the semiconductor chip;
   a plurality of other second bonding pads arranged on the second side of the semiconductor chip;
   a plurality of other first connection wires; and
   a plurality of other first inspection pads arranged on the first side of the semiconductor chip, each of the plurality of the inspection pads connected to the corresponding second bonding pads,
   wherein the first inspection pad is arranged on the first side of the semiconductor chip, and
   wherein each of the plurality of the first connection wires has an identical length.

2. A semiconductor integrated circuit device comprising:
a semiconductor chip embedded in the semiconductor integrated circuit device, the semiconductor chip comprising:
   a first bonding pad arranged on a first side of the semiconductor chip;
   a second bonding pad arranged on a second side of the semiconductor chip;

a first input and output buffer and a second input and output buffer which are coupled to the first and second bonding pads respectively;
a first inspection pad;
a first connecting wire which is laid outside an area where the first and second input and output buffers are arranged and which connects the second bonding pad to the first inspection pad;
a third bonding pad arranged on a third side of the semiconductor chip, the third side facing the first side;
a fourth bonding pad arranged on the second side of the semiconductor chip;
a third input and output buffer and a fourth input and output buffer which are coupled to the third and fourth bonding pads respectively;
a second inspection pad; and
a second connection wire which is laid outside an area where the third and fourth input and output buffers are arranged and which connects the fourth bonding pad to the second inspection pad, wherein the first inspection pad is arranged on the first side of the semiconductor chip and only connected to one bonding pad on the second side of the semiconductor chip such that the second bonding pad on the second side and the first bonding pad on the first side are set to be tested concurrently through respectively probing the first inspection pad and the first bonding pad on the first side, and wherein the second inspection pad is arranged on the third side of the semiconductor chip and only connected to one bonding pad on the second side of the semiconductor chip such that the fourth bonding pad on the second side and the third bonding pad on the third side are set to be tested concurrently through respectively probing the second inspection pad and the third bonding pad on the third side.

* * * * *

UNITED STATES PATENT AND TRADEMARK OFFICE
CERTIFICATE OF CORRECTION

PATENT NO. : 7,190,593 B2  Page 1 of 1
APPLICATION NO. : 10/022732
DATED : March 13, 2007
INVENTOR(S) : Aiki et al.

It is certified that error appears in the above-identified patent and that said Letters Patent is hereby corrected as shown below:

On title page
Item (54):

Please

<u>INSERT</u> -- Hitachi ULSI Systems Co., Ltd. --

Signed and Sealed this

Fourteenth Day of August, 2007

JON W. DUDAS
*Director of the United States Patent and Trademark Office*